(12) United States Patent
Kim

(10) Patent No.: US 11,495,504 B2
(45) Date of Patent: Nov. 8, 2022

(54) SEMICONDUCTOR DEVICE AND MANUFACTURING METHOD OF SEMICONDUCTOR DEVICE

(71) Applicant: SK hynix Inc., Icheon-si (KR)

(72) Inventor: Young Rok Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 165 days.

(21) Appl. No.: 16/990,690

(22) Filed: Aug. 11, 2020

(65) Prior Publication Data
US 2021/0257265 A1    Aug. 19, 2021

(30) Foreign Application Priority Data

Feb. 19, 2020   (KR) .................. 10-2020-0020586

(51) Int. Cl.
| | |
|---|---|
| H01L 27/24 | (2006.01) |
| H01L 21/66 | (2006.01) |
| H01L 27/11582 | (2017.01) |
| H01L 27/11556 | (2017.01) |

(52) U.S. Cl.
CPC ........ H01L 22/20 (2013.01); H01L 27/11556 (2013.01); H01L 27/11582 (2013.01); H01L 27/249 (2013.01)

(58) Field of Classification Search
CPC ...................................................... H01L 22/20
See application file for complete search history.

(56) References Cited

U.S. PATENT DOCUMENTS

2013/0295769 A1*  11/2013  Lin ................... H01L 21/76877
                                                                 438/692

FOREIGN PATENT DOCUMENTS

| | | |
|---|---|---|
| KR | 101421258 B1 | 7/2014 |
| KR | 1020190076049 A | 7/2019 |

* cited by examiner

*Primary Examiner* — Yu-Hsi D Sun
(74) *Attorney, Agent, or Firm* — William Park & Associates Ltd.

(57) ABSTRACT

A method of manufacturing a semiconductor device includes: forming a first stack structure; forming first holes penetrating the first stack structure; forming a second stack structure on the first stack structure; forming second holes penetrating the second stack structure; measuring first direction distances between edges of the first holes and edges of the second holes; and correcting a first direction position at which the second holes are to be formed. The second holes may include one of a first shift hole shifted in a positive first direction from a first hole and a second shift hole shifted in a negative first direction from a first hole.

20 Claims, 29 Drawing Sheets

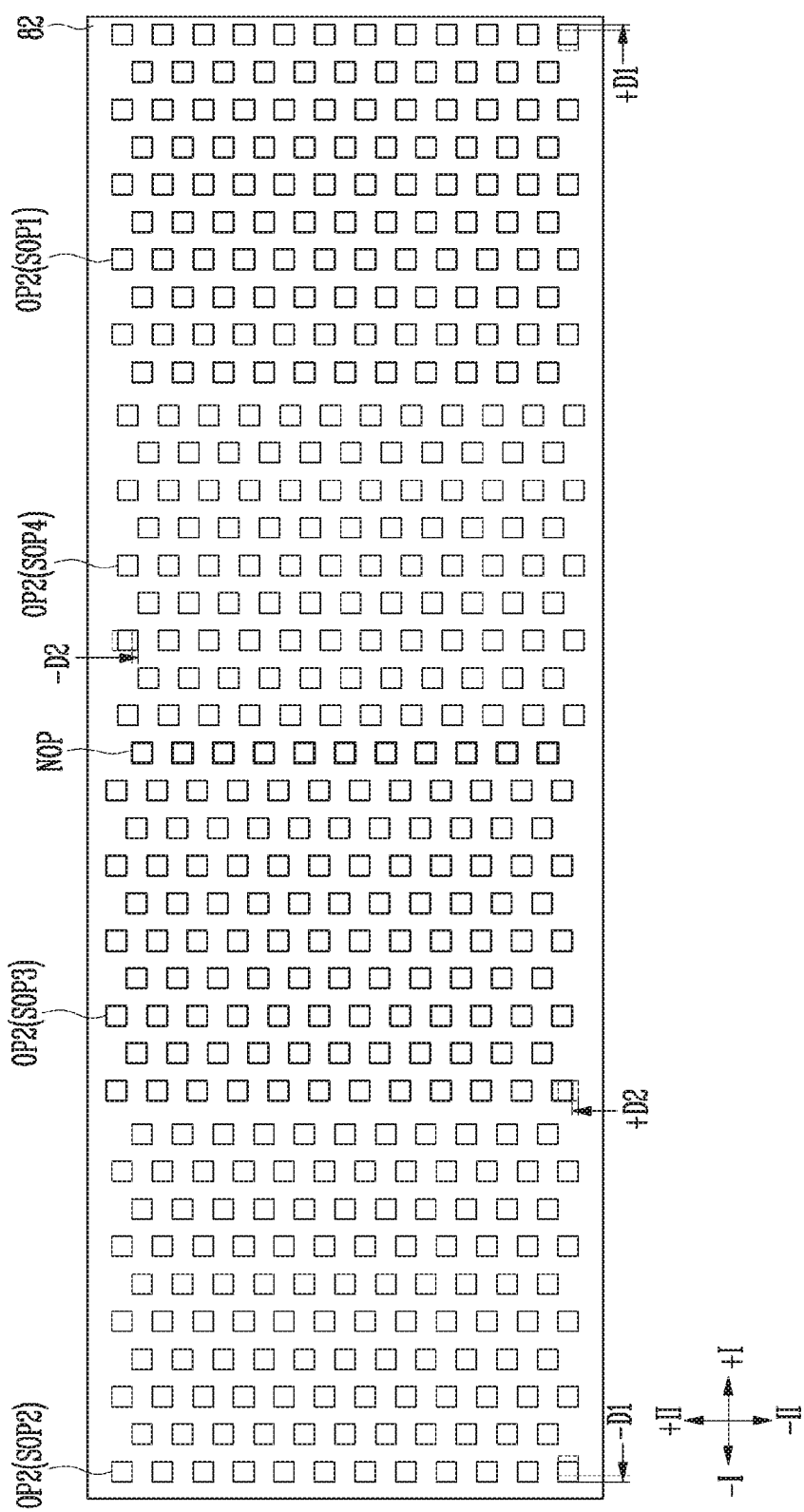

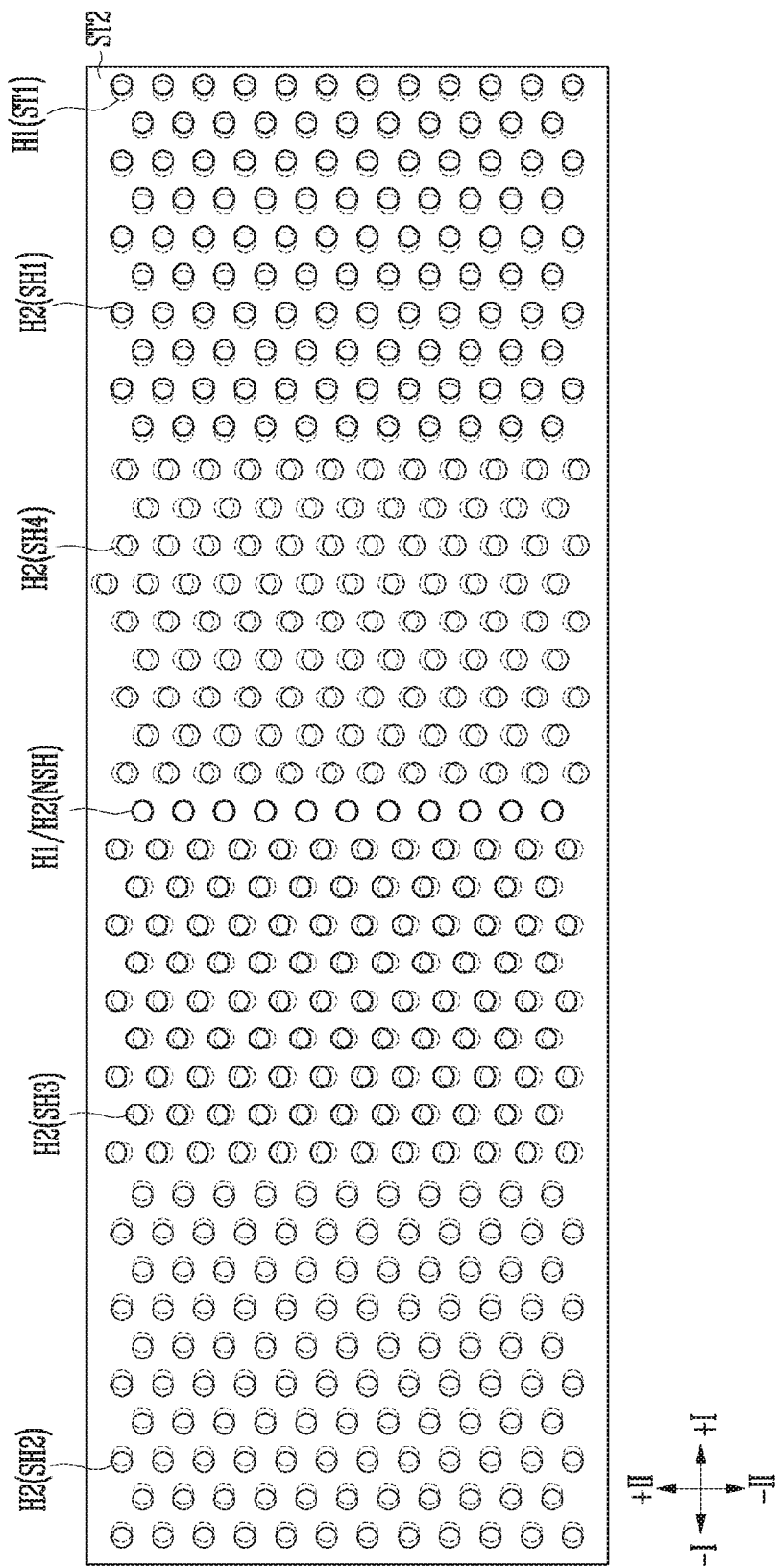

SEMICONDUCTOR DEVICE AND MANUFACTURING METHOD OF SEMICONDUCTOR DEVICE

CROSS-REFERENCE TO RELATED APPLICATION

The present application claims priority under 35 U.S.C. § 119(a) to Korean patent application number 10-2020-0020586, filed on Feb. 19, 2020, in the Korean Intellectual Property Office, the entire disclosure of which is incorporated herein by reference.

BACKGROUND

1. Technical Field

The present disclosure generally relates to an electronic device, and more particularly, to a semiconductor device and a manufacturing method of the semiconductor device.

2. Related Art

A nonvolatile memory device is a memory device in which stored data is maintained even when the supply of power is interrupted. As the improvement of the degree of integration of two-dimensional nonvolatile memory devices with memory cells that are formed over a semiconductor substrate in the form of a single layer has reached the limit, there has been proposed a three-dimensional nonvolatile memory device in which memory cells are formed in a vertical direction over a semiconductor substrate.

The three-dimensional memory device includes interlayer insulating layers and gate electrodes, which are alternately stacked, and channel layers penetrating the interlayer insulating layers and the gate electrodes. Memory cells are stacked along the channel layers. Various structures and manufacturing methods have been developed to improve the operational reliability of the three-dimensional nonvolatile memory device.

SUMMARY

In accordance with an aspect of the present disclosure, there is provided a method of manufacturing a semiconductor device, the method may include: forming a first stack structure; forming first holes penetrating the first stack structure; forming a second stack structure on the first stack structure; forming second holes penetrating the second stack structure; measuring a first direction distance between edges of the first holes and edges of the second holes to calculate a first correction value, positions of the edges of the first holes are exposed through the second holes, respectively; and correcting a first direction position at which the second holes are to be formed by using the first correction value, wherein the second holes include one of a first shift hole shifted in a positive first direction from a first hole and a second shift hole shifted in a negative first direction from a first hole.

In accordance with another aspect of the present disclosure, there is provided a method of manufacturing a semiconductor device, the method including: forming a first stack structure; forming first holes penetrating the first stack structure, by using a first mask including first openings; forming a second stack structure on the first stack structure; forming second holes penetrating the second stack structure, by using a second mask including second openings; measuring first direction distances between edges of the first holes and edges of the second holes to calculate a first correction value, positions of the edges of the first holes are exposed through the second holes, respectively; and correcting a first direction position of the second mask by using the first correction value, wherein the second openings include one of a first shift opening shifted in a positive first direction from a first opening and a second shift opening shifted in a negative first direction from a first opening.

In accordance with still another aspect of the present disclosure, there is provided a semiconductor device including: a first stack structure; a plurality of first holes penetrating the first stack structure; a second stack structure located on the first stack structure; a first shift hole penetrating the second stack structure, the first shift hole being shifted in a positive first direction from a first hole from the plurality of first holes; and a second shift hole penetrating the second stack structure, the second shift hole being shifted in a negative first direction from a first hole from the plurality of first holes.

BRIEF DESCRIPTION OF THE DRAWINGS

Examples of embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will convey the scope of the examples of embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 15A, 15B, and 15C are views illustrating a modification of a mask pattern in accordance with an embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Embodiments may provide a semiconductor device having a stable structure and improved characteristics, and a manufacturing method of the semiconductor device.

FIGS. 1A to 3A, 1B to 3B, and 4A to 4C are views illustrating a manufacturing method of a semiconductor device in accordance with an embodiment of the present disclosure.

Figure 1A:
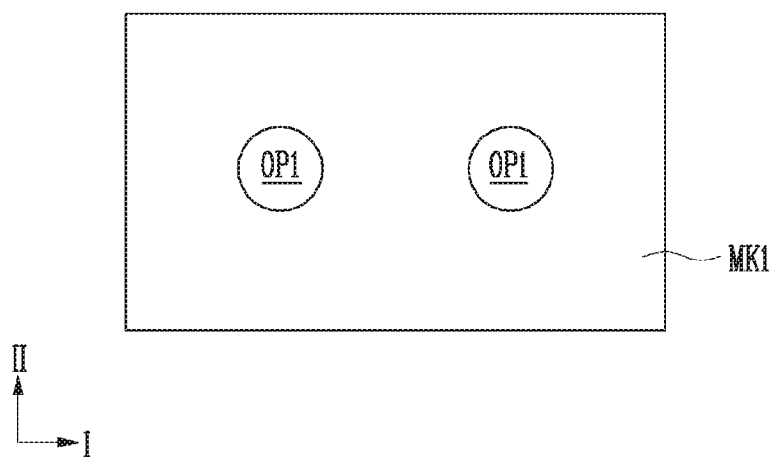
FIGS. 1A, 1B, 2A, 2B, 3A, 3B, 4A, 4B, and 4C are views illustrating a manufacturing method of a semiconductor device in accordance with an embodiment of the present disclosure.
Figure 1B:
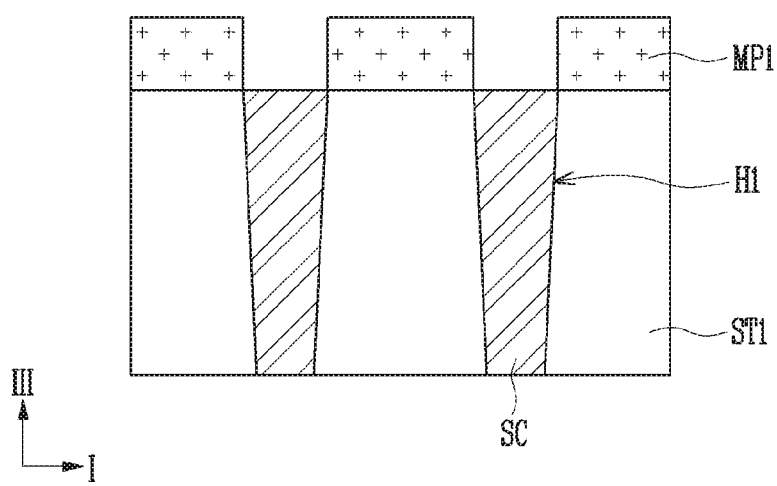

Referring to FIGS. 1A and 1B, a first stack structure ST1 is formed. Subsequently, first holes H1 are formed, which penetrate the first stack structure ST1. For example, the first holes H1 are formed by using a first mask MK1 including first openings OP1. The first mask MK1 may be a photo mask used in an exposure process. After a first mask pattern MP1 is formed on the first stack structure ST1 by using the first mask MK1, the first holes H1 may be formed by etching the first stack structure ST1, using the first mask pattern MP1 as an etch barrier.

The first holes H1 may be arranged in a first direction I and a second direction II intersecting the first direction I. The first holes H1 may expand in a third direction III. The third direction III may be a direction protruding from a plane defined by the first direction I and the second direction II.

Subsequently, a sacrificial layer SC is formed in the first holes H1. The sacrificial layer SC may include a material having a high etch selectivity with respect to the first stack structure ST1. The first stack structure ST1 may include oxide, nitride, etc., and the sacrificial layer SC may include poly-silicon, tungsten, titanium nitride, etc. For example, a penetrating structure may be formed in the first holes H1.

Figure 2A:
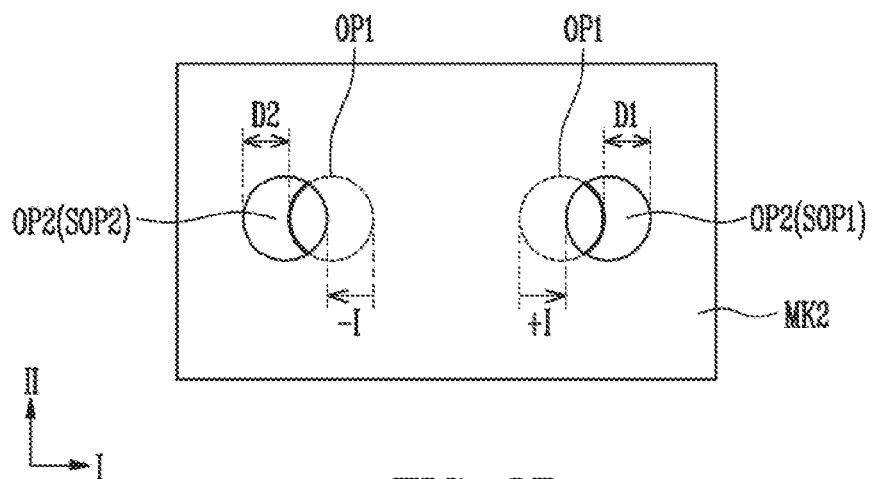
Figure 2B:
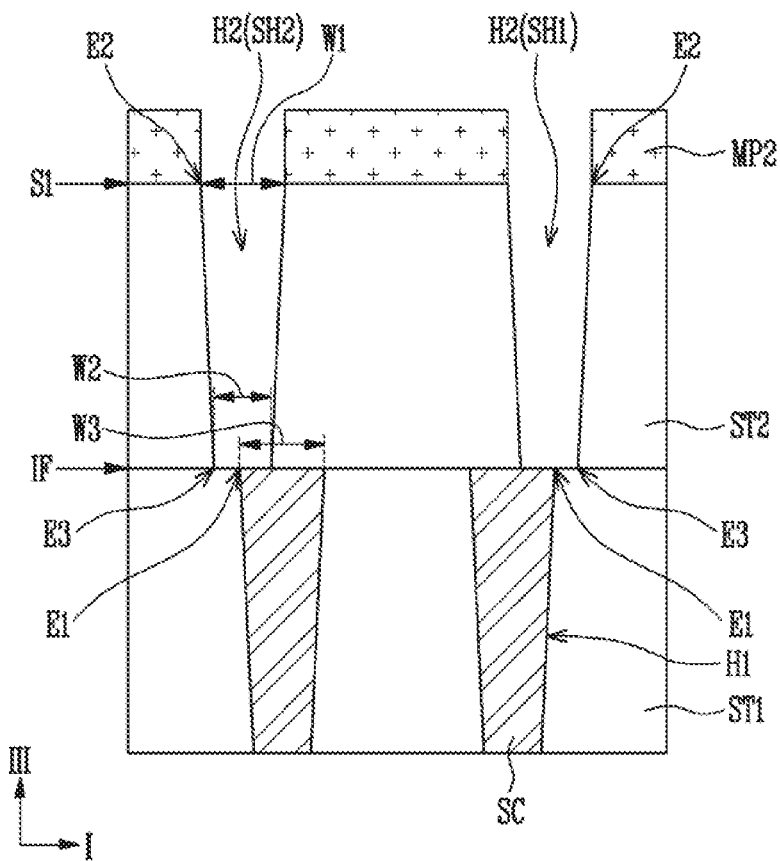

Referring to FIGS. 2A and 2B, a second stack structure ST2 is formed. Subsequently, second holes H2 are formed, which penetrate the second stack structure ST2. For example, the second holes H2 is formed by using a second mask MK2 including second openings OP2. The second mask MK2 may be a photo mask used in an exposure process. The second openings OP2 may include a first shift opening SOP1 and a second shift opening SOP2. The first shift opening SOP1 may be one shifted in a positive first direction +I from the first opening OP1. The second shift opening SOP2 may be one shifted in a negative first direction −I from the first opening OP1. A distance D1 by which the first shift opening SOP1 is shifted and a distance D2 by which the second shift opening SOP2 is shifted merely have different directions but may have the substantially same value. Although not shown in the drawings, the second openings OP2 may further include a non-shift opening which is aligned with the first opening, i.e., is not shifted.

After a second mask pattern MP2 is formed on the second stack structure ST2 by using the second mask MK2, the second holes H2 may be formed by etching the second stack structure ST2, using the second mask pattern MP2 as an etch barrier. The second holes H2 may have a tapered section. Each of the second holes H2 may have a first width W1 at a first surface S1, which is greater than a second width W2 at an interface IF. Each of the first holes H1 may have a third width W3 greater than the second width W2 of each of the second holes H2 at the interface IF.

The second holes H2 may include a first shift hole SH1 corresponding to the first shift opening SOP1 and a second shift hole SH2 corresponding to the second shift opening SOP2. The first and second shift holes SH1 and SH2 may be located by reflecting the shifted distances D1 and D2 of the second openings OP2 and a misalignment value of the second mask MK2.

The first shift hole SH1 may be shifted in the positive first direction +I from the first hole H1. Therefore, a first edge E1 of the first hole H1 may be exposed in the positive first direction +I through the first shift hole SH1. The second shift hole SH2 may be shifted in the negative first direction −I from the first hole H1. Therefore, a first edge E1 of the first hole H1 may be exposed in the negative first direction −I through the second shift hole SH2. Accordingly, a position of the first edge E1 at the interface IF can be checked. In particular, positions of the first edges E1 in the positive first direction +I and the negative first direction −I may be checked. In an embodiment, positions of the first edges E1 in the positive first direction +I and the negative first direction −I may be checked through the respective second holes H2. In an embodiment, positions of the first edges E1 in the positive first direction +I and the negative first direction −I may be checked through the respective second openings OP2.

Although not shown in the drawings, the second holes H2 may further include a non-shift hole corresponding to the non-shift opening. The non-shift hole may be located by reflecting the misalignment value of the second mask MK2.

Figure 3A:
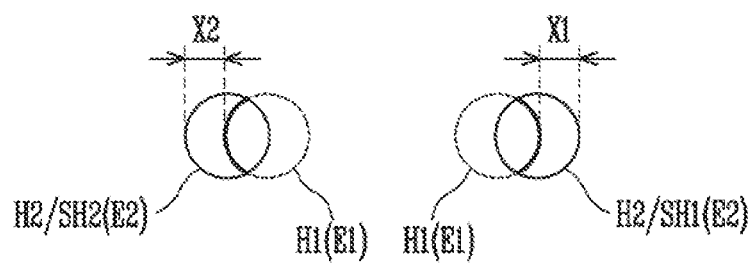
Figure 3B:
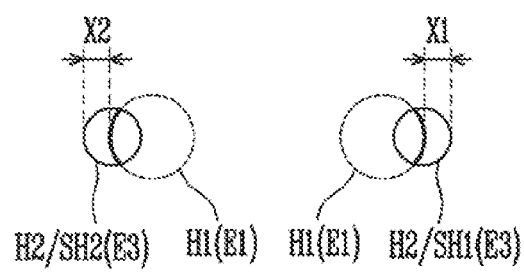

Referring to FIGS. 3A and 3B, a first direction distance between the first edge E1 of the first hole H1 and edges E2 and E3 of the second hole H2 is measured through the second hole H2.

Referring to FIG. 3A, a first distance X1 between the first edge E1 of the first hole H1, which is exposed through the first shift hole SH1, and a second edge E2 of the first shift hole SH1 may be measured. A second distance X2 between the first edge E1 of the first hole H1, which is exposed through the second shift hole SH2, and a second edge E2 of the second shift hole SH2 may be measured. The first edge E1 may be an edge at the interface IF, and the second edge E2 may be an edge at the first surface.

Referring to FIG. 3B, a first distance X1 between the first edge E1 of the first hole H1, which is exposed through the first shift hole SH1, and a third edge E3 of the first shift hole SH1 may be measured. A second distance X2 between the first edge E1 of the first hole H1, which is exposed through the second shift hole SH2, and a third edge E3 of the second shift hole SH2 may be measured. The first edge E1 and the third edge E3 may be edges at the interface IF.

Figure 4A:
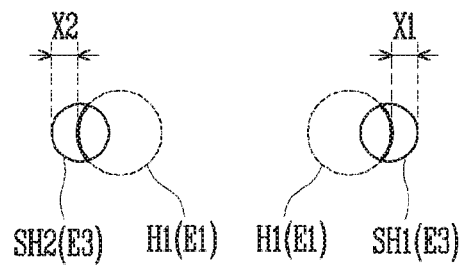
Figure 4B:
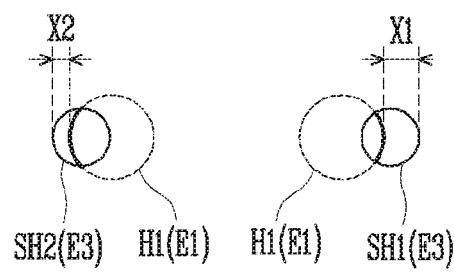
Figure 4C:
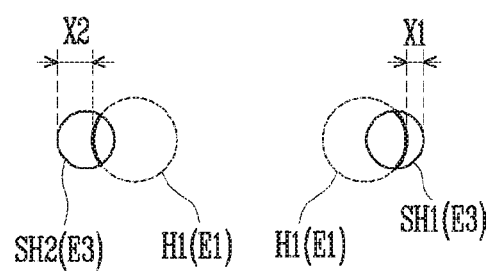

Referring to FIGS. 4A to 4C, a correction value with respect to a first direction position at which the second holes H2 are to be formed may be calculated by using a measurement result. By comparing the first distance X1 and the second distance X2, it may be determined whether the second holes H2 have been formed to be shifted in the positive first direction +I or whether the second holes H2 have been formed to be shifted in the negative first direction. In addition, a first direction position at which the second holes H2 are to be formed in a next lot may be corrected based on the measurement result. The position of the second mask Mk2 (see FIG. 2A) is corrected in the next lot, so that the first direction position at which the second holes H2 are to be formed can be corrected.

Referring to FIG. 4A, the first distance X1 and the second distance X2 may be the substantially same. Accordingly, it can be seen that the second holes H2 have been formed at a target position. That is, it can be seen that the second mask MK2 has been aligned at the target position. Therefore, the first direction position at which the second holes H2 are to be formed in the next lot is not corrected. In an embodiment, for example, the position of the second mask MK2 in the next lot may be kept substantially the same as the position of the second mask MK2 in the preceding lot.

Referring to FIG. 4B, the first distance X1 may be greater than the second distance X2. Accordingly, it can be seen that the second holes H2 have been shifted in the positive first direction +I from the target position. That is, it can be seen that the second mask MK2 has been shifted in the positive first direction +I from the target position. Therefore, the position of the second mask MK2 in the next lot is corrected in the negative first direction −I. Accordingly, the position of the second holes H2 to be formed in the next lot may be corrected in the negative first direction −I. In an embodiment, for example, the position of the second mask MK2 in the next lot may be corrected in the negative first direction −I to shift the second holes H2 back to the target position.

Referring to FIG. 4C, the second distance X2 may be greater than the first distance X1. Accordingly, it can be seen that the second holes 1-12 have been shifted in the negative first direction −I from the target position. That is, it can be seen that the second mask MK2 has been shifted in the negative first direction −I from the target position. Therefore, the position of the second mask MK2 in the next lot is corrected in the positive first direction +I. Accordingly, the position of the second holes H2 to be formed in the next lot may be corrected in the positive first direction +I. A position correction value of the second mask MK2 may be calculated by using the following Equation 1. When the correction value is 0, the position of the second mask MK2 might not be corrected (see FIG. 4A). When the correction value is negative (−), the position of the second mask MK2 may be corrected in the negative first direction −I (see FIG. 4B). When the correction value is positive (+), the position of the second mask MK may be corrected in the positive first direction +I (see FIG. 4C).

$$\text{Correction value} = (X2 - X1)/2 \quad \text{Equation 1}$$

According to the manufacturing method described above, shifted second holes H2 are formed by using a second mask MK2 including the second openings OP2 shifted in the positive first direction +I and the negative first direction −I. Thus, edges of the first holes H1 can be exposed through the shifted second holes H2, and an overlapping degree between the first holes H1 and the second holes H2 can be finely measured. Further, the position of the second mask MK2 to be used in the next lot is corrected based on the measurement result, so that the overlapping degree between the first holes H1 and the second holes H2 in the first direction can be increased.

Meanwhile, the first stack structure ST1, the second stack structure ST2, the first holes H1, and the second holes H2 may correspond to a monitoring pattern. The monitoring pattern may have a structure similar to a main structure such as a cell stack structure including stacked memory cells or an interlayer insulating layer including an interconnection structure including a line, a contact plug, and the like. When the cell stack structure or the interlayer insulating layer is formed, the first stack structure ST1 and the second stack structure ST2 may be formed together with the cell stack structure or the interlayer insulating layer. When a channel hole or contact hole is formed, the first and second holes H1 and H2 may be formed together with the channel hole or contact hole.

When a main pattern and a monitoring pattern are formed together, a mask used to form the monitoring pattern and a mask used to form the main pattern are similarly misaligned. Therefore, a correction value with respect to the monitoring pattern may be calculated, and the calculated correction value may be applied to the main pattern. The position of a channel hole or contact hole formed in the next lot may be corrected by using a correction value measured through the second holes H2. That is, the overlapping degree of the main structure in the first direction can be increased by using the monitoring pattern.

Figure 5:
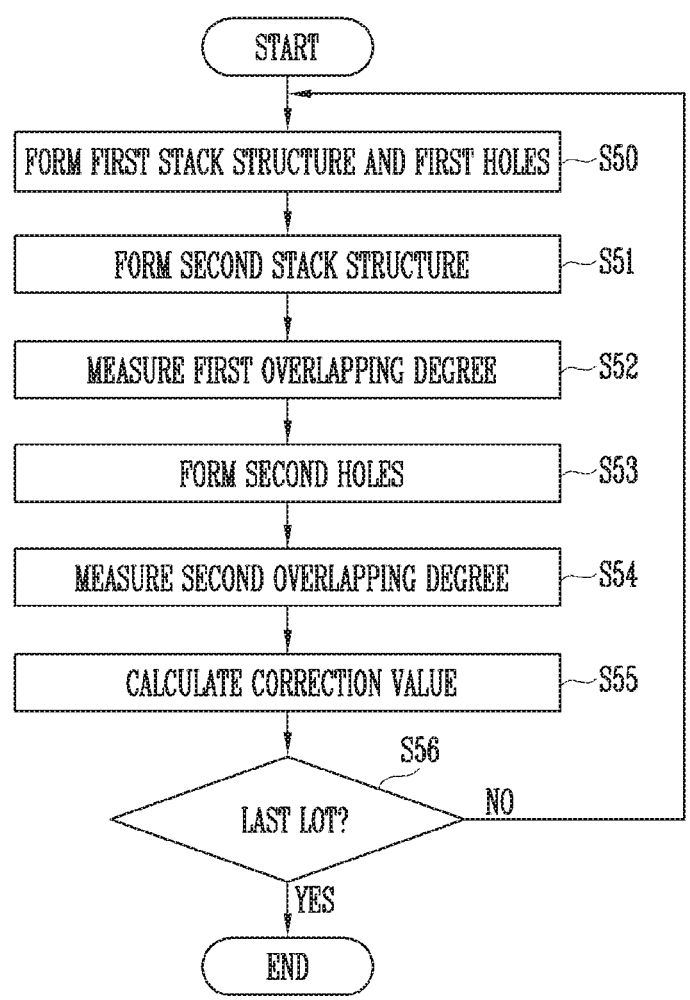
FIG. 5 is a flowchart illustrating a manufacturing method of a semiconductor device in accordance with an embodiment of the present disclosure.

FIG. 5 is a flowchart illustrating a manufacturing method of a semiconductor device in accordance with an embodiment of the present disclosure.

First, a first stack structure ST1 and first holes H1 penetrating the first stack structure ST1 are formed (S50). Subsequently, a second stack structure ST2 is formed (S51).

Subsequently, a second mask pattern MP2 is formed on the second stack structure ST2. The second mask pattern MP2 may be formed by exposing and developing a mask layer, using a second mask MK2. In addition, a first overlapping degree of the second mask pattern MP2 may be measured by using an alignment key located in a scribe lane region (S52).

Subsequently, the second stack structure ST2 is etched by using the second mask pattern MP2 as an etch barrier, so that second holes H2 are formed (S53). Subsequently, a second overlapping degree of the second holes H2 and the first holes H1 may be measured (554). A distance between an edge of the second holes H2 and an edge of the first holes H1 may be measured through the second holes H2.

Subsequently, a position correction value of the second mask MK2 is calculated (S55). The correction value may be calculated based on a second overlapping degree, or be calculated by considering both the first overlapping degree and the second overlapping degree. Subsequently, a subsequent process such as a process of forming a penetrating structure in the first and second holes H1 and H2 is performed. The penetrating structure may be a channel structure, a contact plug, a line, an electrode, etc.

Subsequently, it is checked whether a corresponding lot is the last lot (S56). When the corresponding lot is the last lot (S56, Yes), a manufacturing process is ended. When the corresponding lot is not the last lot (S56, No), a process of a next lot is newly started. In addition, when the second holes H2 are formed in the next lot (S53), the correction value calculated above is applied. A correction value calculated from a monitoring pattern may be equally applied to a main pattern.

Figure 6A:
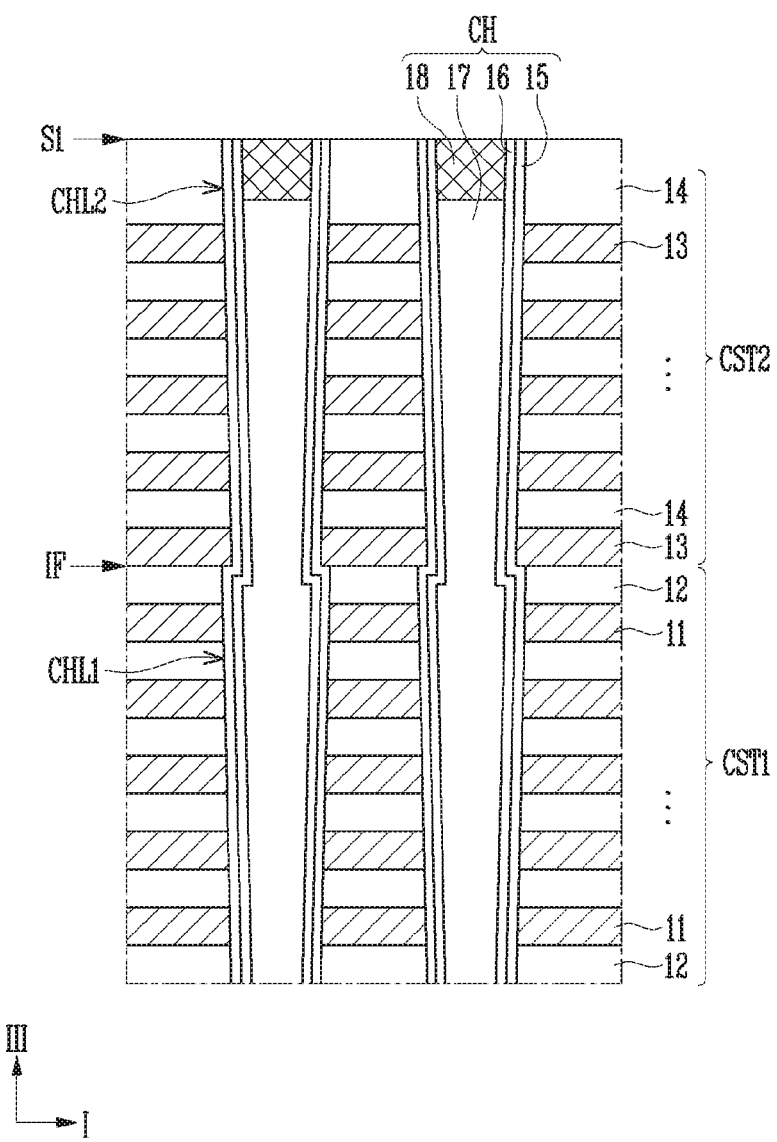
FIGS. 6A, 6B, and 6C are sectional views illustrating a structure of a semiconductor device in accordance with an embodiment of the present disclosure.
Figure 6B:
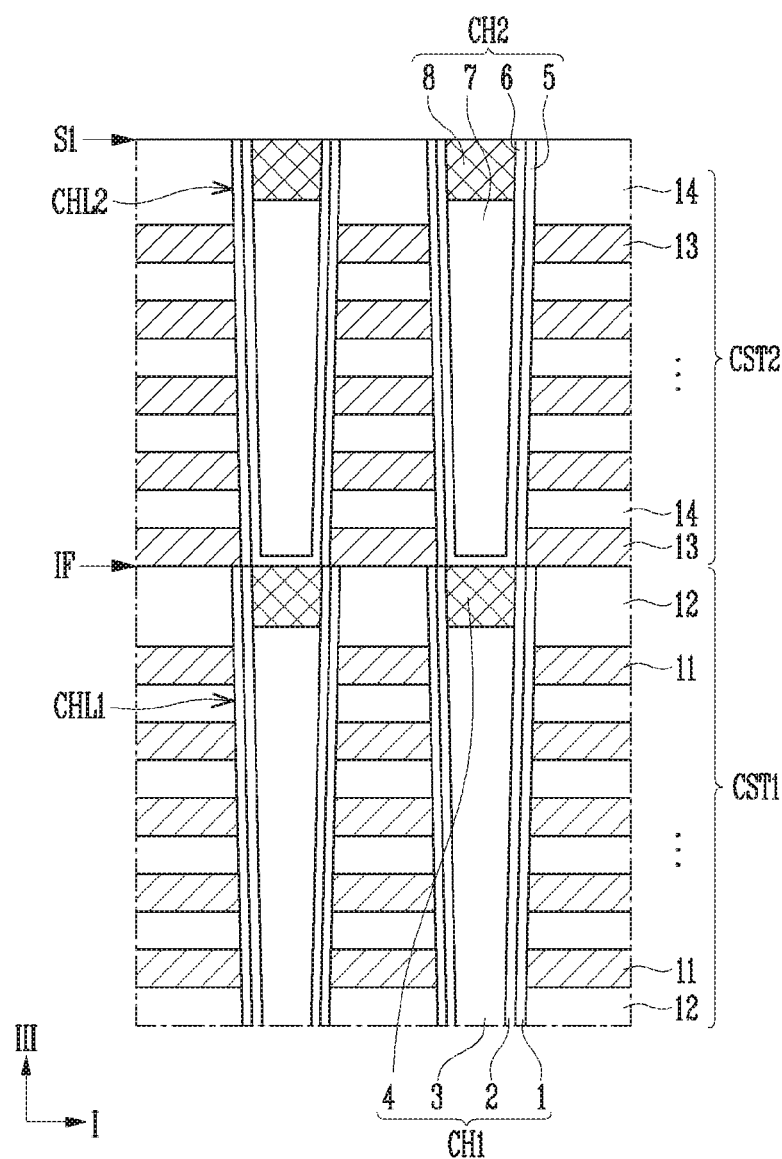
Figure 6C:
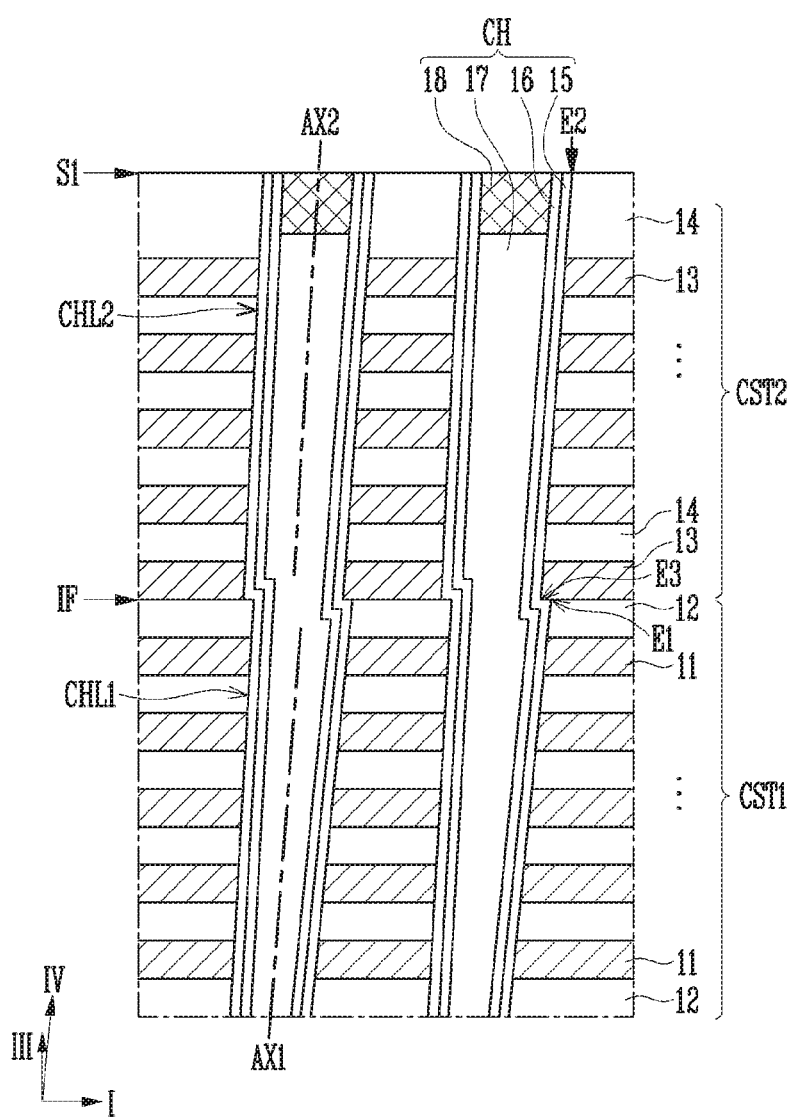

FIGS. 6A to 6C are sectional views illustrating a structure of a semiconductor device in accordance with an embodiment of the present disclosure, which represent a structure of a main stack structure. Hereinafter, descriptions of contents overlapping with those described above will be omitted.

Referring to FIG. 6A, the semiconductor device in accordance with the embodiment of the present disclosure may include a cell stack structure as a main stack structure. The semiconductor device may include a first cell stack structure CST1, a second cell stack structure CST2, and a channel structure CH.

The first cell stack structure CST1 may include first conductive layers 11 and first insulating layers 12, which are alternately stacked. The first conductive layers 11 and the first insulating layers 12 may be stacked along a third direction III. The first conductive layers 11 may be gate electrodes of a select transistor, a memory cell, and the like. The first conductive layers 11 may include a conductive material such as poly-silicon, tungsten, or metal. The first insulating layers 12 are used to insulate the stacked first conductive layers 11 from each other; and may include an insulating material such as oxide or nitride. At least one lowermost conductive layer among the first conductive layers 11 may be a first select line, and the other first conductive layers 11 may be word lines. The first select line may be a source select line or a drain select line.

The first cell stack structure CST1 and the second cell stack structure CST2 may be stacked along the third direction III. The second cell stack structure CST2 may be located on the top or bottom of the first cell stack structure CST1. The second cell stack structure CST2 may include second conductive layers 13 and the second insulating layers 14, which are alternately stacked. The second conductive layers 13 may be gate electrodes of a select transistor, a memory cell, and the like. The second conductive layers 13 may include a conductive material such as poly-silicon, tungsten, or metal. The second insulating layers 14 are used to insulate the stacked second conductive layers 13 from each other, and may include an insulating material such as oxide or nitride. At least one uppermost conductive layer among the second conductive layers 13 may be a second select line, and the other second conductive layers 13 may be word lines. The second select line may be a drain select line or a source select line.

The first cell stack structure CST1 may include first channel holes CHL1, and the second cell stack structure CST2 may include second channel holes CHL2. The second channel holes CHL2 may be respectively connected to the first channel holes CHL1. The first channel holes CHL1 may be adjacent to each other in a first direction I, and each of the first channel holes CHL1 may expand in the third direction III. The third direction III may be a stacking direction of the first and second cell stack structures CST1 and CST2. The third direction III may be a direction protruding from a first surface S1 or an interface IF.

Each of the first and second channel holes CHL1 and CHL2 may have a tapered section. At the interface IF between the first cell stack structure CST1 and the second cell stack structure CST2, the first channel hole CHL1 may have a width greater than that of the second channel hole CHL2.

The channel structure CH may penetrate the first cell stack structure CST1 and the second cell stack structure CST2. The channel structure CH may be adjacent to each other in the first direction I, and each of the channel structures CH may expand in the third direction III. The channel structure CH may be formed in the first channel hole CHL1 penetrating the first cell stack structure CST1 and the second channel hole CHL2 penetrating the second cell stack structure CST2. One channel structure CH may be formed in the second channel hole CHL2 and the first channel hole CHL1, which are connected to each other.

The channel structure CH may include a channel layer 16, and further include at least one of a memory layer 15, a gap fill layer 17, and a pad 18. The channel layer 16 is a region in which a channel of a select transistor, a memory cell or the like is formed, and may include a semiconductor material such as silicon (Si) or germanium (Ge) or include a nano structure material such as nano dots, nano tubes, or graphene. The memory layer 15 may include at least one of a tunnel insulating layer, a data storage layer, and a blocking layer. The data storage layer may be used as a substantial data storage, and include a floating gate, a charge trap material, poly-silicon, nitride, a variable resistance material, a phase change material, etc. The gap fill layer 17 may be formed in the channel layer 16, and include oxide, etc. The pad 18 may be connected to the channel layer 16, and include a conductive material. The channel layer 16 may be connected to a line such as a bit line or a source line through the pad 18.

According to this structure, a select transistor, a memory cells, and the like may be located in regions in which first and second conductive layers 11 and 13 intersect with the channel structure CH. Select transistors and memory cells, which share the channel structure CH, may constitute one memory string. For example, the memory string may include at least one first select transistor, memory cells, and at least one second select transistor.

Referring to FIG. 6B, a first channel structure CH1 may be located in the first channel hole CHL1, and a second channel structure CH2 may be located in the second channel hole CHL2. The first channel structure CH1 may include a first channel layer 2, and further include at least one of a first memory layer 1, a first gap fill layer 3, and a first pad 4. The second channel structure CH2 may include a second channel layer 6, and further include at least one of a second memory layer 5, a second gap fill layer 7, and a second pad 8. The second channel layer 6 may be connected to the first channel layer 2 through the first pad 4.

Referring to FIG. 6C, the first channel hole CHL1 and the second channel hole CHL2 may be misaligned. The first channel holes CHL1 and the second channel holes CHL2 may be formed through processes separate from each other. After the first cell stack structure CST1 is formed and the first channel hole CHL1 is formed, the second cell stack structure CST2 may be formed, and the second channel hole CHL2 may be formed. Therefore, the first and second channel holes CHL1 and CHL2 may be tilted and formed due to a limitation of a process, etc. Alternatively, the first and second channel holes CHL1 and CHL2 may be dislocated at the interface IF.

Each of the first and second channel holes CHL1 and CHL2 may expand in a fourth direction IV. The fourth direction IV may be a direction protruding from the first surface S1 or the interface IF. The fourth direction IV may be a direction intersecting the third direction III. In addition, an axis AX1 of the first channel hole CHL1 and an axis AX2 of the second channel hole CHL2 may be dislocated.

A degree to which a first edge E1 of the first channel hole CHL1 and a third edge E3 of the second channel hole CHL2 are dislocated in the first direction I is greater than that to which the first edge E1 of the first channel hole CHL1 and a second edge E2 of the second channel hole CHL2 are dislocated in the first direction I. Therefore, although the first edge E1 and the second edge E2 are aligned in the third direction III, the first edge E1 and the third edge E3 may be misaligned at the interface IF.

Thus, in order to improve an overlapping degree, the alignment of the third edge E3 and the first edge E1 is to be improved in addition to the alignment of the second edge E2 and the first edge E1. In a manufacturing method of the semiconductor device in accordance with the embodiment of the present disclosure, alignment of the first channel holes CHL1 and the second channel holes CHL2 is monitored by using the monitoring pattern described with reference to FIGS. 1A to 5.

When the first and second cell stack structures CST1 and CST2 and the first and second channel holes CHL1 and CHL2 are formed, a monitoring pattern is formed, which has a structure similar to that of the first and second cell stack structures CST1 and CST2 and the first and second channel holes CHL1 and CHL2. The monitoring pattern may include first and second stack structures corresponding to the first and second cell stack structures CST1 and CST2, include first and second holes corresponding to the first and second channel holes CHL1 and CHL2, and include a penetrating structure corresponding to the channel structure CH. Thus, the alignment of the first channel holes CHL1 and the second channel hole CHL2 can be monitored through the monitoring pattern, and the overlapping degree can be improved.

FIGS. 7A to 9A and 7B to 9B are views illustrating a structure of a semiconductor device in accordance with an embodiment of the present disclosure. Each of FIGS. 7A to 9A is a sectional view, and each of FIGS. 7B to 9B is a layout of an interface IF shown in each of FIGS. 7A to 9A. Hereinafter, descriptions of contents overlapping with those described above will be omitted.

Figure 7A:
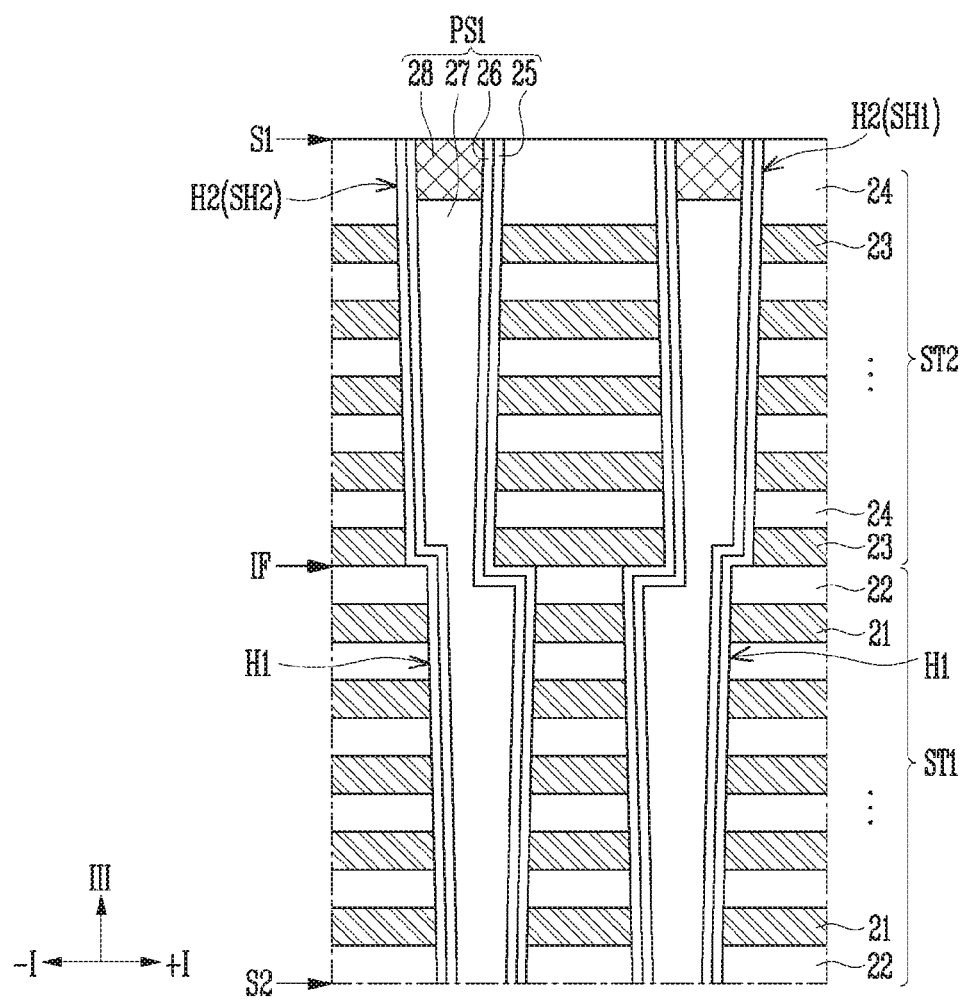
FIGS. 7A, 7B, 8A, 8B, 9A, and 9B are views illustrating a structure of a semiconductor device in accordance with an embodiment of the present disclosure.
Figure 7B:
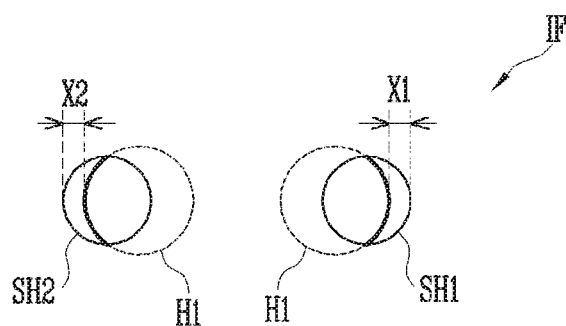

Referring to FIGS. 7A and 7B, the semiconductor device in accordance with the embodiment of the present disclosure may include a first stack structure ST1, a second stack structure ST2, and a penetrating structure PS1. The first and second stack structures ST1 and ST2 may correspond to a monitoring pattern having a structure similar to that of a cell stack structure. The penetrating structure PS1 may correspond to a monitoring pattern having a structure similar to that of a channel structure.

The first stack structure ST1 may include first material layers 21 and second material layers 22, which are alternately stacked. The first material layers 21 may include a material having a high etch selectivity with respective to the second material layers 22. In an example, the first material layers 21 may include a sacrificial material such as nitride, and the second material layers 22 may include an insulating material such as oxide. In another example, the first material layers may include a conductive material such as poly-silicon or tungsten, and the second material layers 22 may include an insulating material such as oxide.

The first stack structure ST1 may include first holes H1. The first hole H1 may have the substantially same width at an interface IF and a second surface S2, or have a width at the interface IF, which is greater than that at the second surface S2. The first hole H1 may have a tapered section.

The second stack structure ST2 may be located on the top of the first stack structure ST1. The second stack structure ST2 may include third material layers 23 and fourth material layers 24, which are alternately stacked. The third material layers 23 may include a material having a high etch selectivity with respect to the fourth material layers 24. In an example, the third material layers 23 may include a sacrificial material such as nitride, and the fourth material layers 24 may include an insulating material such as oxide. In another example, the third material layers 23 may include a conductive material such as poly-silicon or tungsten, and the fourth material layers 24 may include an insulating material such as oxide.

The second stack structure ST2 may include second holes H2. The second hole H2 may have the substantially same width at a first surface S1 and the interface IF, or have a width at the first surface S1, which is greater than that at the interface IF. The second hole H2 may have a tapered section. At the interface IF between the first stack structure ST1 and the second stack structure ST2, the first hole H1 may have a width greater than that of the second hole H2.

The second holes H2 may include a first shift hole SH1 and a second shift hole SH2, which are shifted in different directions with respect to the first holes H1. The first shift hole SH1 may be shifted in a positive first direction +I from the first hole H1. The second shift hole SH2 may be shifted in a negative first direction −I from the first hole H1.

The penetrating structure PS1 may penetrate the first stack structure ST1 and the second stack structure ST2. The penetrating structure PS1 may be formed in the first hole H1 and the second hole H2. The penetrating structure PS1 may include a dummy channel layer 26, and further include at least one of a dummy memory layer 25, a dummy gap fill layer 27, and a dummy pad 28.

The penetrating structure PS1 may have a structure similar to that of the channel structure CH described with reference to FIG. 6A. The dummy channel layer 26 may have the substantially same structure as the channel layer 16, and include the substantially same material as the channel layer 16. The dummy channel layer 26 may be one formed by using the process of forming the channel layer 16. The dummy memory layer 25 may have the substantially same structure as the memory layer 15, and include the substantially same material as the memory layer 15. The memory layer 25 may be one formed by using the process of forming the memory layer 15. The dummy gap fill layer 27 may have the substantially same structure as the gap fill layer 17, and include the substantially same material as the gap fill layer 17. The dummy gap fill layer 27 may be one formed by using the process of forming the gap fill layer 17. The dummy pad 28 may have the substantially same structure as the pad 18, and include the substantially same material as the pad 18. The dummy pad 28 may be one formed by using the process of forming the pad 18. The penetrating structure PS1 may have a structure similar to that shown in FIG. 6B.

FIG. 7B illustrates relative positions of the first hole H1 and the second hole H2 at the interface. Referring to FIG. 7B, an edge of the first shift hole SH1 and an edge of the first hole H1 may be spaced apart from each other at a first distance X1 in the first direction I. An edge of the second shift hole SH2 and an edge of the first hole H1 may be spaced apart from each other at a second distance X2 in the first direction I. The first distance X1 and the second distance X2 may be the substantially the same. That is, it can be seen that, in a manufacturing process, a mask for forming the second holes H2 is aligned at a target position, and the first and second shift holes SH1 and SH2 are formed at the target position.

Although not shown in the drawing, a main structure corresponding to the monitoring pattern described with reference to FIGS. 7A and 7B may also be formed at the target position. In a case where second channel holes CHL2 are formed when the first and second shift holes SH1 and SH2 are formed, a mask for forming the second channel holes CHL2 is aligned at the target position, and the second channel holes CHL2 are formed at the target position. That is, the second channel holes CHL2 are aligned in first channel holes CHL1.

Figure 8A:
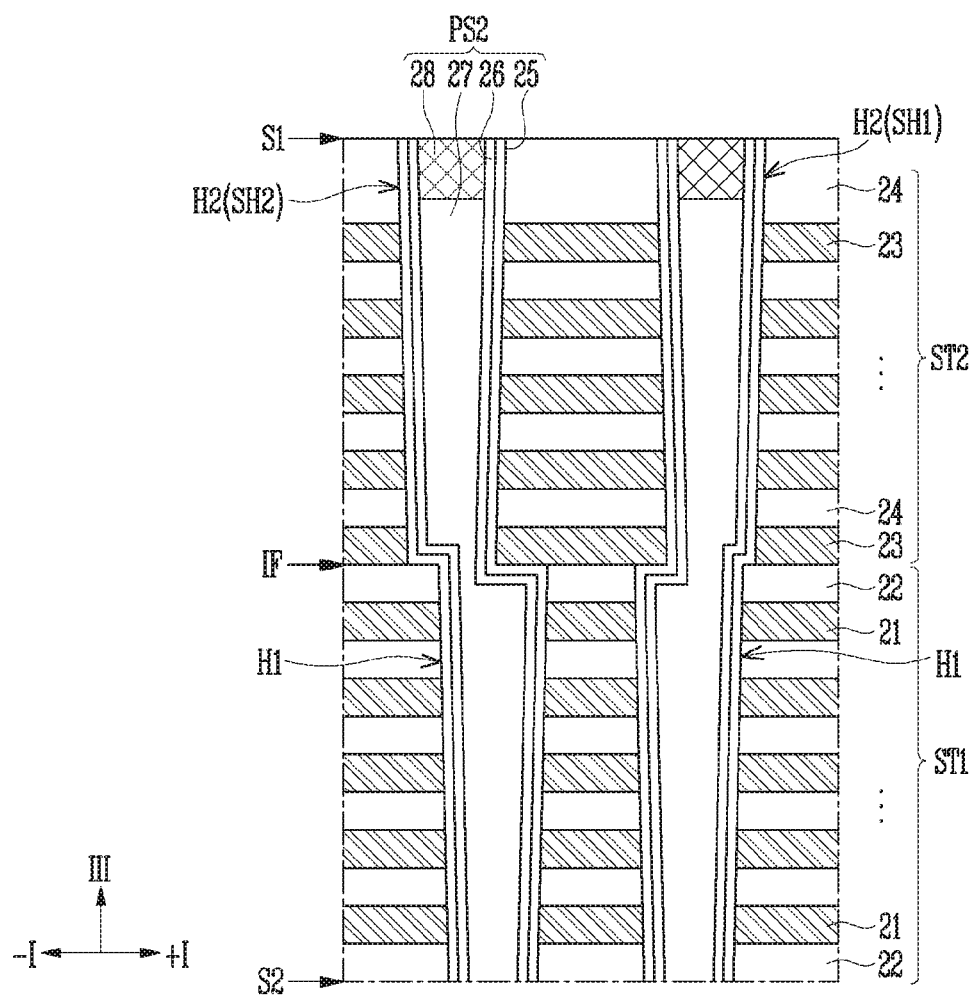
Figure 8B:
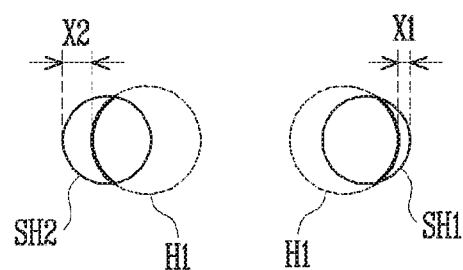

Referring to FIGS. 8A and 8B, the semiconductor device in accordance with the embodiment of the present disclosure may include a first stack structure ST1, a second stack structure ST2, and a penetrating structure PS2. The first and second stack structures ST1 and ST2 may correspond to a cell structure, and the penetrating structure PS2 may correspond to a channel structure. The penetrating structure PS2 may penetrate the first stack structure ST1 and the second stack structure ST2. The penetrating structure PS2 may be formed in first and second holes H1 and H2.

The second holes H2 may include a first shift hole SH1 and a second hole SH2, which are shifted in different directions with respect to the first holes H1. The first shift hole SH1 may be shifted in the positive first direction +I from the first hole H1. The second shift hole SH2 may be shifted in the negative first direction −I from the first hole H1. However, a distance by which the first shift hole SH1 is shifted and a distance by which the second shift hole SH2 is shifted may be different from each other.

Referring to FIG. 8B, an edge of the first shift hole SH1 and an edge of the first hole H1 may be spaced apart from each other at a first distance X1, and an edge of the second shift hole SH2 and an edge of the first hole H1 may be spaced apart from each other at a second distance X2. The second distance X2 may have a value greater than that of the first distance X1. That is, it can be seen that, in the manufacturing process, a mask for forming the second holes H2 is positioned to be shifted in the negative first direction −I from a target position, and the second holes H2 are entirely formed to be shifted in the negative first direction −I form the target position.

Although not shown in the drawing, a main structure corresponding to the monitoring pattern described with reference to FIGS. 8A and 8B may also be positioned to be shifted in the negative first direction −I from the target position. In a case where second channel holes CHL2 are formed when the first and second shift holes SH1 and SH2 are formed, a mask for forming the second channel holes CHL2 is located to be shifted in the negative first direction −I from the target position, and the second channel holes CHL2 are formed to be shifted in the negative first direction −I from the target position. That is, the second channel holes CHL2 are misaligned in the negative first direction −I with respect to first channel holes CHL1.

Figure 9A:
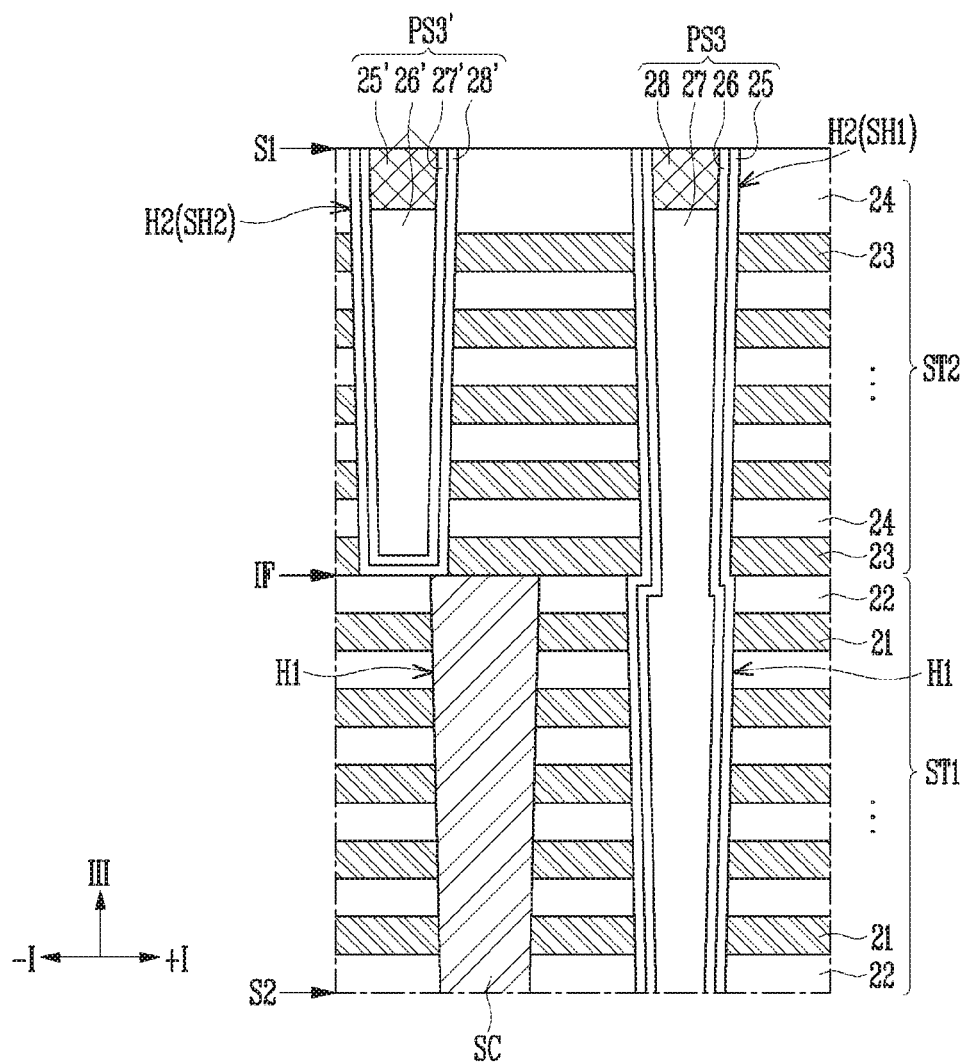
Figure 9B:
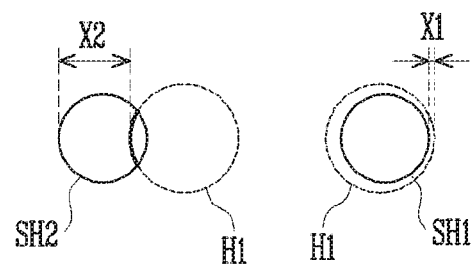

Referring to FIGS. 9A and 9B, the semiconductor device in accordance with the embodiment of the present disclosure may include a first stack structure ST1, a second stack structure ST2, and penetrating structures PS3 and PS3'. The first and second stack structures ST1 and ST2 and the penetrating structures PS3 and PS3' may correspond to a monitoring pattern having a structure similar to that of a cell stack structure and a channel structure. The first and second stack structures ST1 and ST2 may correspond to the cell stack structure, and the penetrating structures PS3 and PS3' may correspond to the channel structure.

The penetrating structure PS3 may penetrate the first stack structure ST1 and the second structure ST2, and be formed in first and second holes H1 and H2. The penetrating structure PS3' may penetrate the second stack structure ST2, and be formed in the second hole H2. A sacrificial layer Sc may be formed in a first hole H1 corresponding to the penetrating structure PS3'.

The second holes H2 may include a first shift hole SH1 and a second shift hole SH2, which are shifted in different directions or are shifted in the same direction.

Referring to FIG. 9B, an edge of the first shift hole SH1 and an edge of the first hole H1 may be spaced apart from each other at a first distance X1, and an edge of the second shift hole SH2 and an edge of the first hole H1 may be spaced apart from each other at a second distance X2. The first distance X1 and the second distance X2 may be different from each other, and the second distance X2 may have a value greater than that of the first distance X1. In addition, the edge of the first hole H1 may not be exposed in the first shift hole SH1. That is, it can be seen that, in the manufacturing process, a mask for forming the second holes H2 is positioned to be shifted in the negative first direction −I from a target position, and the second holes H2 are entirely formed to be shifted in the negative first direction −I form the target position. Also, it can be seen that the second holes H2 are formed to be further shifted in the negative first direction −I form the second holes H2 described with reference to FIGS. 8A and 8B.

Although not shown in the drawing, a main structure corresponding to the monitoring pattern described with reference to FIGS. 8A and 8B may also be positioned to be shifted in the negative first direction −I from the target position. In a case where second channel holes CHL2 are formed when the first and second shift holes SH1 and SH2 are formed, a mask for forming the second channel holes CHL2 is located to be shifted in the negative first direction −I from the target position, and the second channel holes CHL2 are formed to be shifted in the negative first direction −I from the target position. That is, the second channel holes CHL2 are misaligned in the negative first direction −I with respect to first channel holes CHL1.

Figure 10:
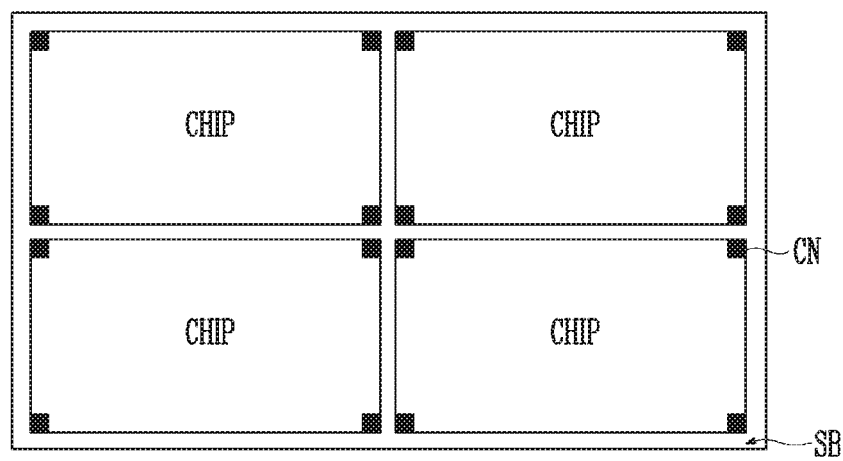
FIG. 10 is a layout illustrating a structure of a semiconductor device in accordance with an embodiment of the present disclosure.
Figure 11A:
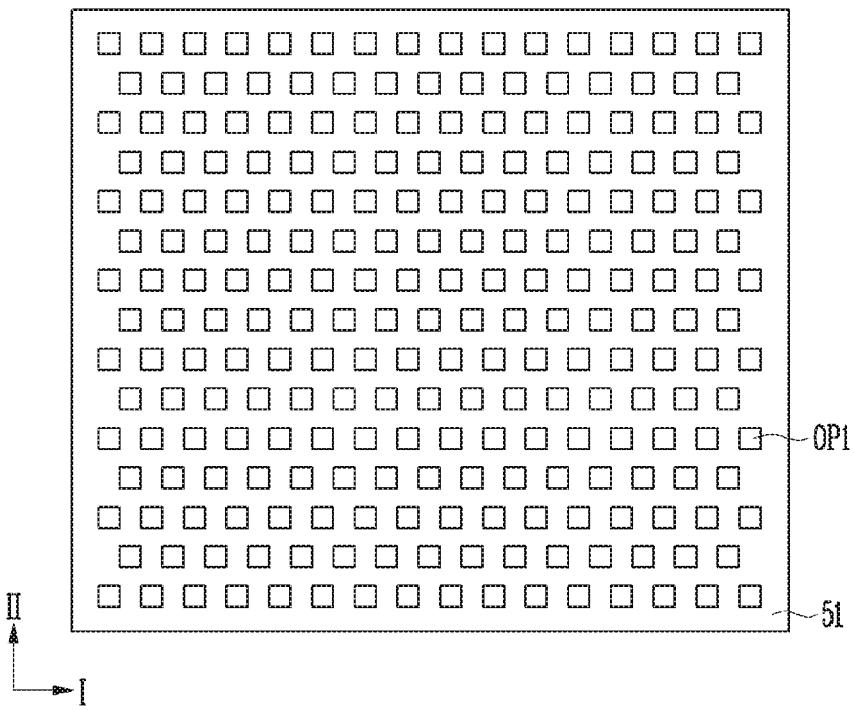
FIGS. 11A, 11B, 11C, 11D, 11E, 12A, 12B, 12C, 12D, 12E, 13A, and 13B are views illustrating a manufacturing method of a semiconductor device in accordance with an embodiment of the present disclosure.
Figure 11B:
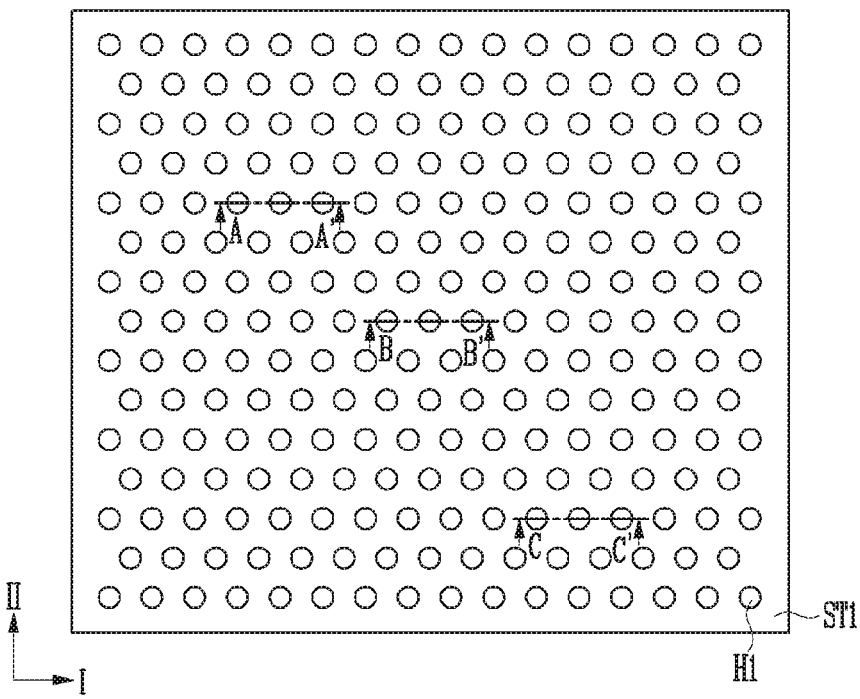
Figure 11C:
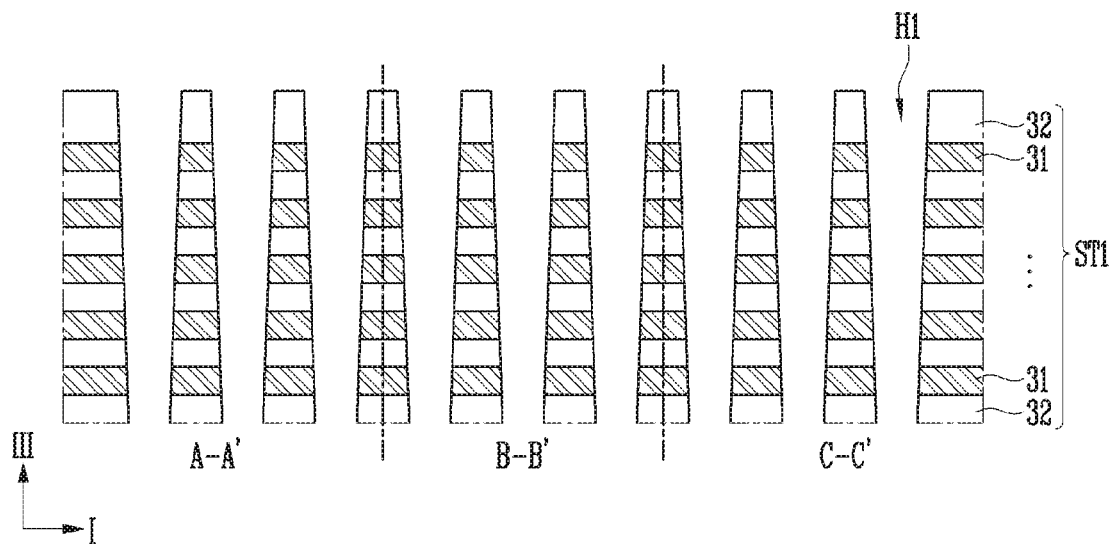
Figure 11D:
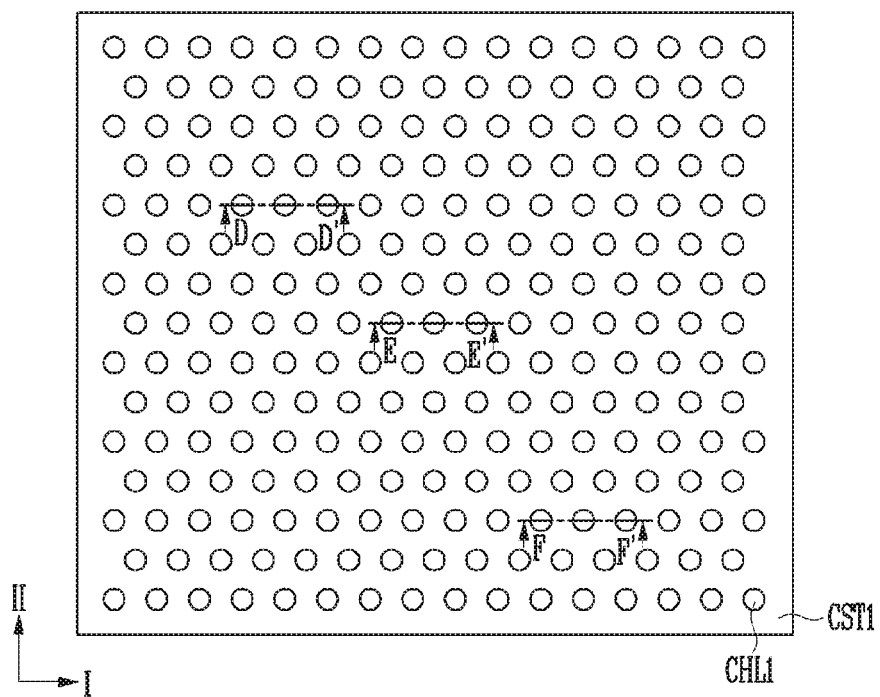
Figure 11E:
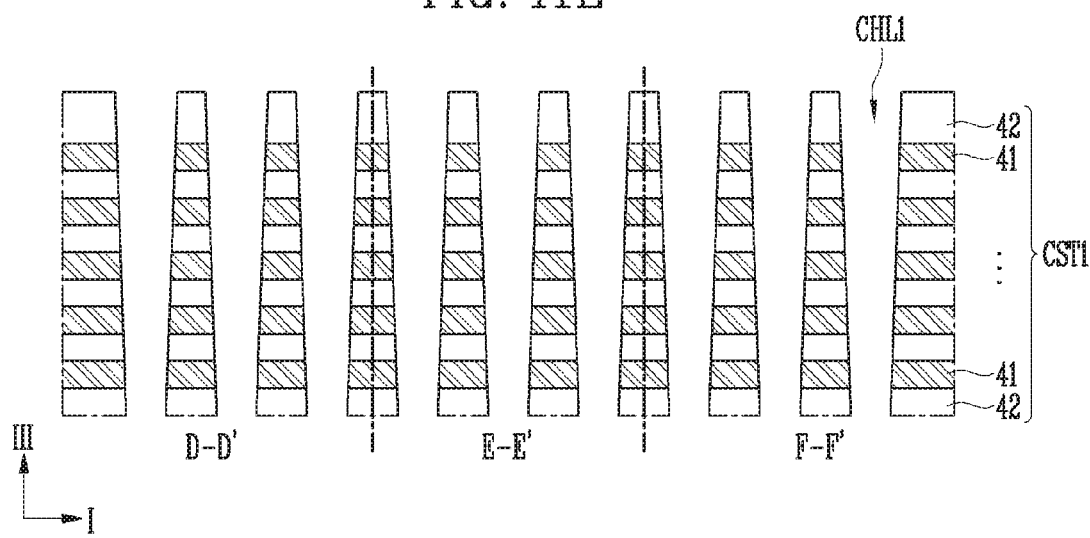
Figure 12A:
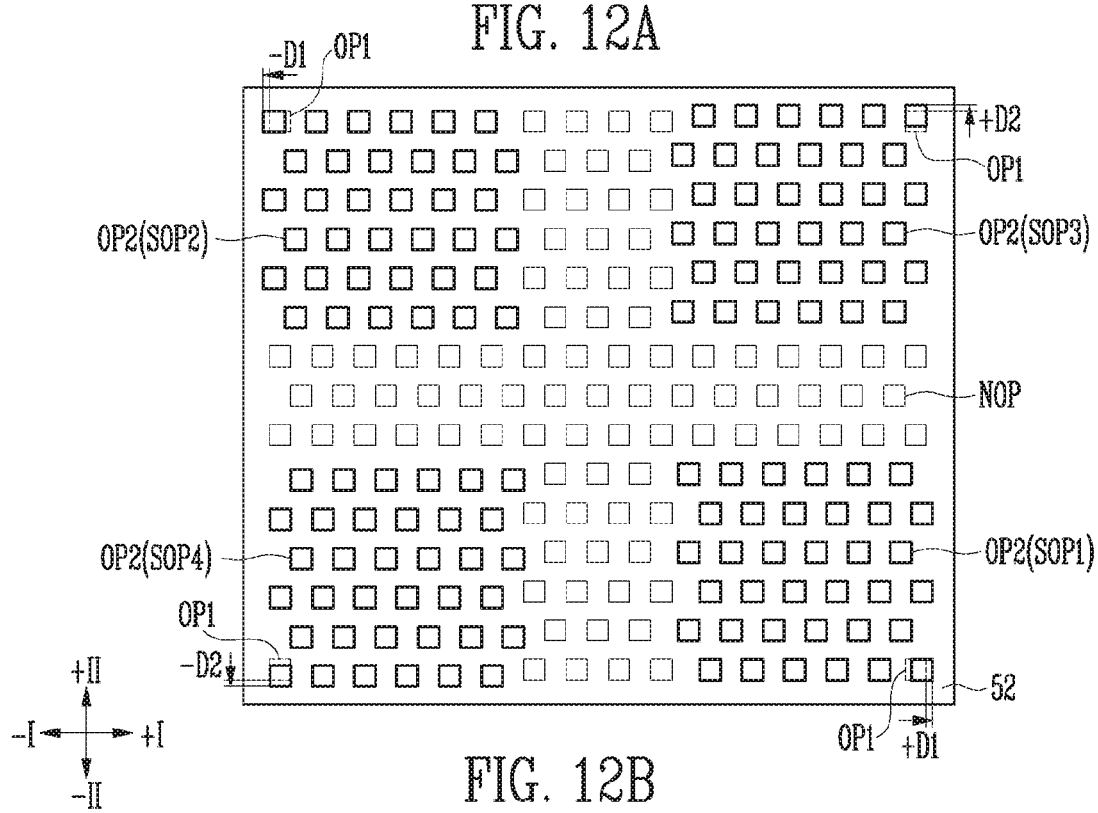
Figure 12B:
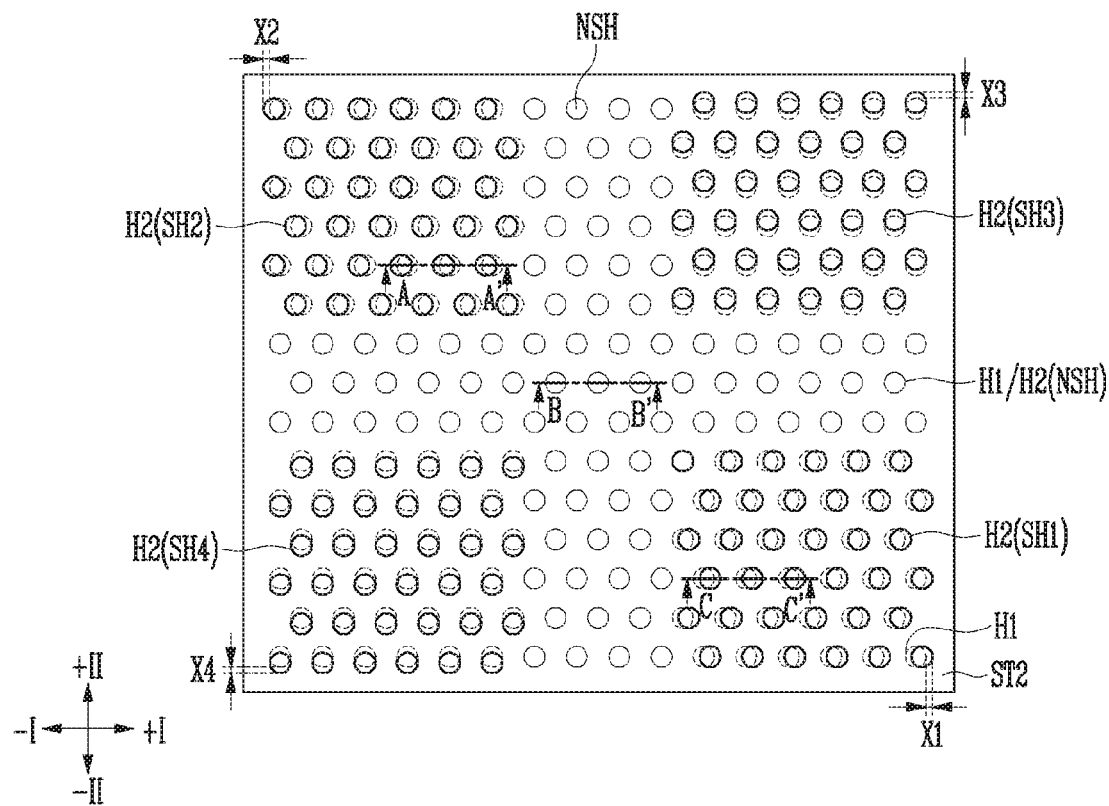
Figure 12C:
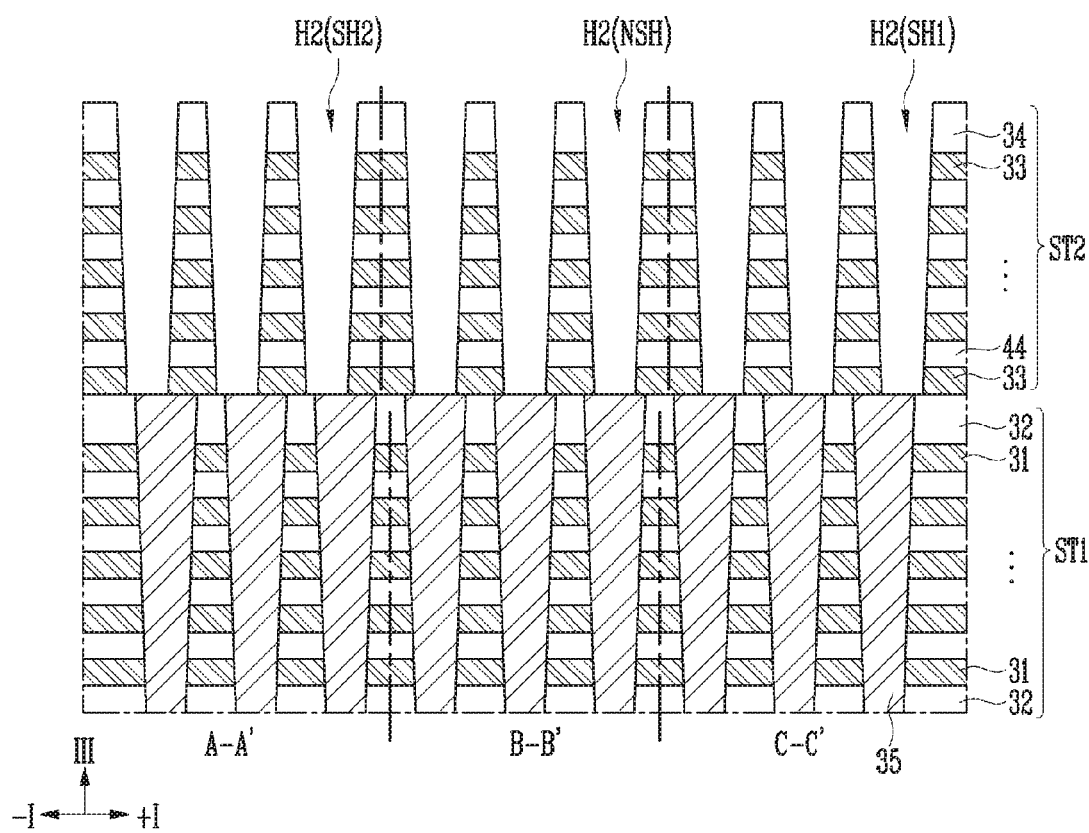
Figure 12D:
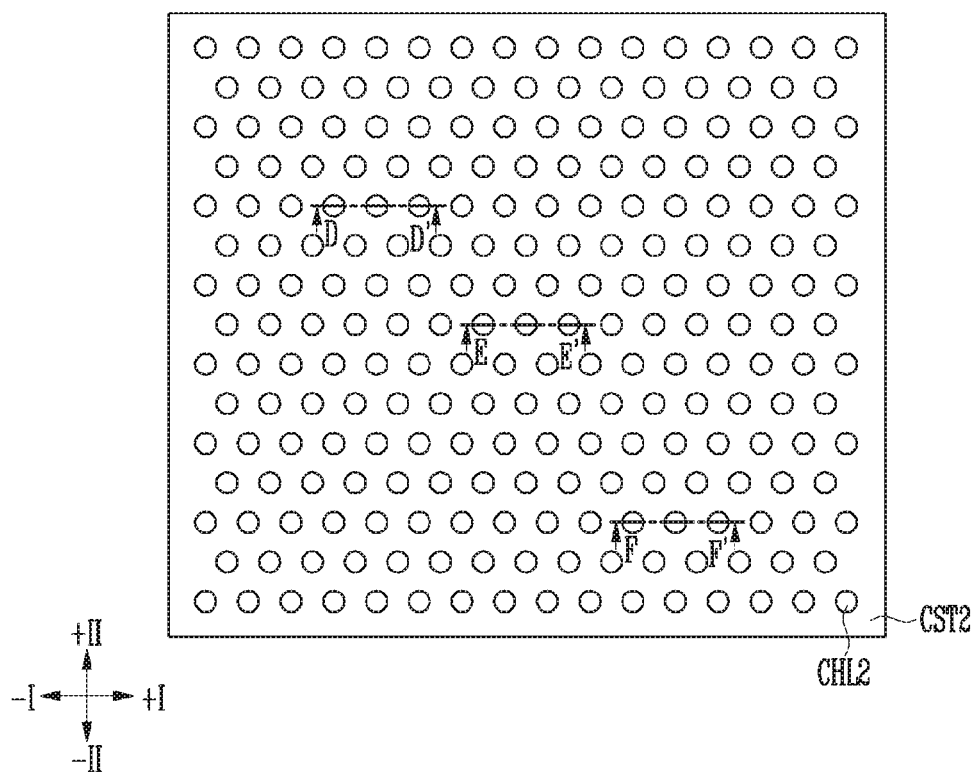
Figure 12E:
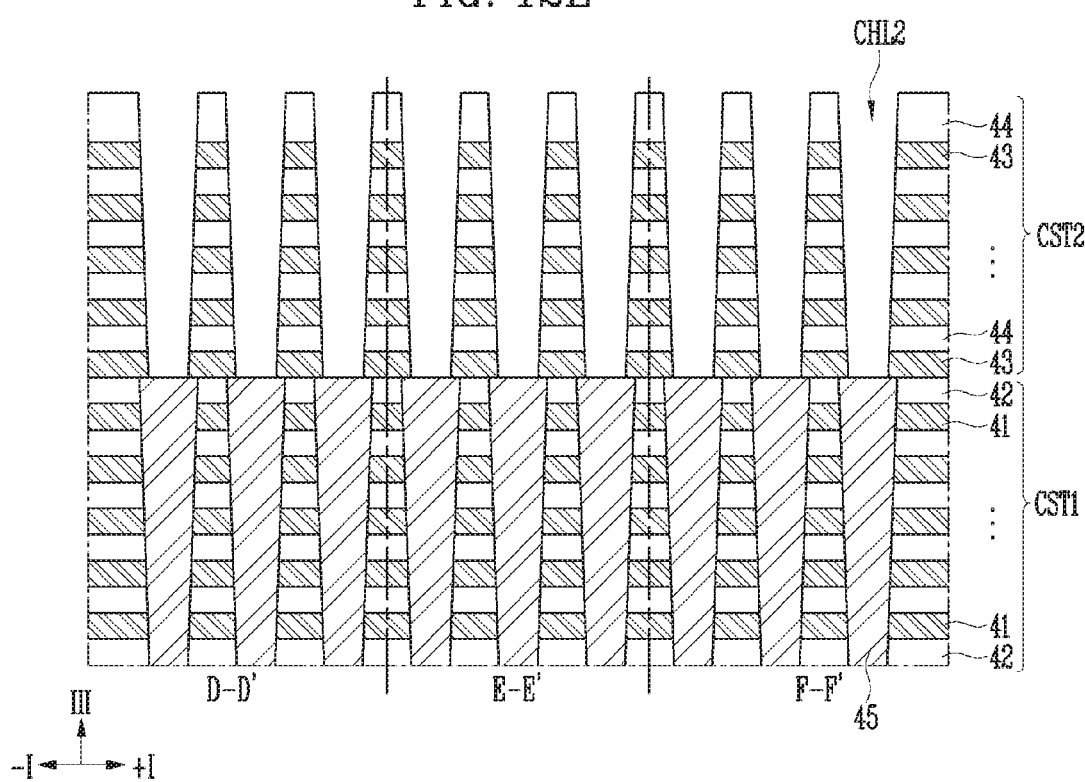

FIG. 10 is a layout illustrating a structure of a semiconductor device in accordance with an embodiment of the present disclosure. Hereinafter, descriptions of contents overlapping with those described above will be omitted.

Referring to FIG. 10, the semiconductor device in accordance with the embodiment of the present disclosure may include a chip CHIP, and a monitoring pattern may be located in the chip CHIP. The monitoring pattern may be located at a corner CN of the chip CHIP. The chip CHIP may include a cell region in which memory cells are stacked and a dummy region, and the monitoring pattern in accordance with the embodiment of the present disclosure may be located in the dummy region. A stack structure, a penetrating structure, and the like, which are included in the monitoring pattern, may be positioned separately from a cell stack structure, a channel structure, and the like.

When a plurality of chips CHIP are formed on a wafer, a scribe lane region SB may be defined between the chips CHIP. The scribe lane region SB may be a cutting region for cutting the plurality of chips CHIP formed on the wafer into individual chips CHIP. An alignment key used in a manufacturing process may be located in the scribe lane region SB. Although the alignment key is removed in the cutting process, the monitoring pattern formed in the chip CHIP may remain.

FIGS. 11A to 11E, 12A to 12E, 13A, and 13B are views illustrating a manufacturing method of a semiconductor device in accordance with an embodiment of the present disclosure. Hereinafter, descriptions of contents overlapping with those described above will be omitted.

Referring to FIGS. 11A to 11E, a first stack structure ST1 is formed, which includes first material layers 31 and second material layers 32, which are alternately stacked. A first cell stack structure CST1 is formed, which includes first material layers 41 and second material layers 42, which are alternately stacked. The first material layers 41 may be formed when the first material layers 31 are formed, and the second material layers 42 may be formed when the second material layers 32 are formed.

The first material layers 31 and 41 may include a material having a high etch selectivity with respect to the second material layers 32 and 42. In an example, the first material layers 31 and 41 may include a sacrificial material such as nitride, and the second material layers 32 and 42 may include an insulating material such as oxide. In another example, the first material layers 31 and 41 may include a conductive material such as poly-silicon or tungsten, and the second material layers 32 and 42 may include an insulating material such as oxide.

Subsequently, first holes H1 are formed, which penetrate the first stack structure ST1. The first holes H1 may be formed by using a first mask 51 including first openings OP1. The first mask 51 may be a photo mask. The first openings OP1 may be arranged in a first direction I and a second direction II intersecting the first direction I. In addition, first openings OP1 adjacent in the first direction I may be arranged to be staggered in the second direction, or first openings OP1 adjacent in the second direction II may be arranged to be staggered in the first direction I. The first holes H1 may be located corresponding to the first openings OP1.

First channel holes CHL1 may be formed, which penetrate the first cell stack structure CST1 when the first holes H1 are formed. The first channel holes CHL1 may be formed by using a mask having the same shape as the first mask 51. Therefore, the arrangement, sectional shape, tilt angle, etc. of the first channel holes CHL1 may be substantially equal to those of the first holes H1.

Referring to FIGS. 12A to 12E, first sacrificial layers 35 are formed in the first holes H1. When the first sacrificial layers 35 are formed, second sacrificial layers 45 may be formed in the first channel holes CHL1. The first and second sacrificial layers 35 and 45 may include a material having a high etch selectivity with respect to the first and second material layers 31, 32, 41, and 42. Dummy channel structures and channel structures may be formed instead of the forming of the first sacrificial layers 35 and the second sacrificial layers 45.

Subsequently, a second stack structure ST2 is formed on the first stack structure ST1. The second stack structure ST2 may include third material layers 33 and fourth material layers 34, which are alternately stacked. A second cell stack structure CST2 is formed on the first cell stack structure CST1. The second cell stack structure CST2 may include third material layers 43 and fourth material layers 44, which are alternately stacked. The third material layers 43 may be formed when the third material layers 33 are formed, and the fourth material layers 44 may be formed when the fourth material layers 34 are formed.

The third material layers 33 and 34 may include a material having a high etch selectivity with respect to the fourth material layers 34 and 44. In an example, the third material layers 33 and 43 may include a sacrificial material such as nitride, and the fourth material layers 34 and 44 may include an insulating material such as oxide. In another example, the third material layers 33 and 43 may include a conductive material such as poly-silicon or tungsten, and the fourth material layers 34 and 44 may include an insulating material such as oxide.

Subsequently, second holes H2 are formed, which penetrate the second stack structure ST2. The second holes H2 may be formed by using a second mask 52 including second openings OP2. The second mask 52 may be a photo mask. The second openings OP2 may be located corresponding to the first openings OP1. The second openings OP2 may include first shift openings SOP1 shifted by a first distance D1 in a positive first direction +I and second shift openings SOP2 shifted by the first distance D1 in a negative first direction −I. The second openings OP2 may include third shift openings SOP3 shifted by a second distance D2 in a positive second direction +II and fourth shift openings SOP4 shifted by the second distance D2 in a negative second direction −II. The second openings OP2 may include the first shift openings SOP1, the second shift openings SOP2, the third shift openings SOP3, and the fourth shift openings SOP4. The first distance D1 and the second distance D2 may have the substantially same value, or have different values. Also, the second openings OP2 may further include non-shift openings NOP aligned with the first openings OP1.

The first shift openings SOP1, the second shift openings SOP2, the third shift openings SOP3, the fourth shift openings SOP4, and the non-shift openings NOP may be arranged in various forms. In this embodiment, a case where the non-shift openings SOP1 are arranged in a cross form has been illustrated. The first shift openings SOP1 and the second shift openings SOP2 may be located to face each other in an oblique direction, and the third shift openings SOP3 and the fourth shift openings SOP4 may be located to face each other in an oblique direction. However, the arrangement form and sequence of the second openings OP2 are not limited thereto, and may be variously changed.

The second holes H2 may be located corresponding to the second openings OP2. The second hole H2 may include first shift holes SH1 shifted in the positive first direction +I, second shift holes SH2 shifted in the negative first direction −I, third shift holes SH3 shifted in a positive second direction +II, and fourth shift holes SH4 shifted in a negative second direction. The second holes H2 may further include non-shift holes NSH aligned with the first holes H1. In addition, due to misalignment of the second mask 52, the second holes H2 may be entirely formed to be shifted in the positive first direction +I, the negative first direction −I, the positive second direction +II, or the negative second direction −II.

When the second holes H2 are formed, second channel holes CHL2 may be formed, which penetrate the second cell stack structure CST2. The second channel holes CHL2 may be formed by using a third mask having the substantially same shape as the first mask 51. Unlike the second mask 52, the third mask does not any shift opening, and therefore, target positions of the second channel holes CHL2 are aligned with the first channel holes CHL1. However, when the third mask is misaligned, the second channel holes CHL2 may be entirely misaligned.

Since the second channel holes CHL2 are formed when the second holes H2 are formed, the second mask 52 is misaligned by misalignment of the third mask. Therefore, each of the second channel holes CHL and the second holes H2 may be formed to be shifted by the substantially same distance from the target position thereof.

Subsequently, a distance between an edge of the first hole H1 and an edge of the second hole H2 is measured through the second holes H2. A first direction distance X1 between a bottom surface edge of the first shift hole SH1 and a top surface edge of the first hole H1 may be measured through the first shift hole SH1. A first direction distance X2 between a bottom surface edge of the second shift hole SH2 and a top surface edge of the first hole H1 may be measured through the second shift hole SH2. A second direction distance X3 between a bottom surface edge of the third shift hole SH3 and a top surface edge of the first hole H1 may be measured through the third shift hole SH3. A second direction distance X4 between a bottom surface edge of the fourth shift hole SH4 and a top surface edge of the first hole H1 may be measured through the fourth shift hole SH4.

Subsequently, a position correction value of the second mask 52 is calculated by using a measurement result. A correction value (i.e., first direction correction value) may be calculated by using the first direction distance X1 and the first direction distance X2. A correction value (i.e., second direction correction value) may be calculated by using the second direction distance X3 and the second direction distance X4. In an embodiment, the second direction correction value may be (X4−X3)/2.

Figure 13A:
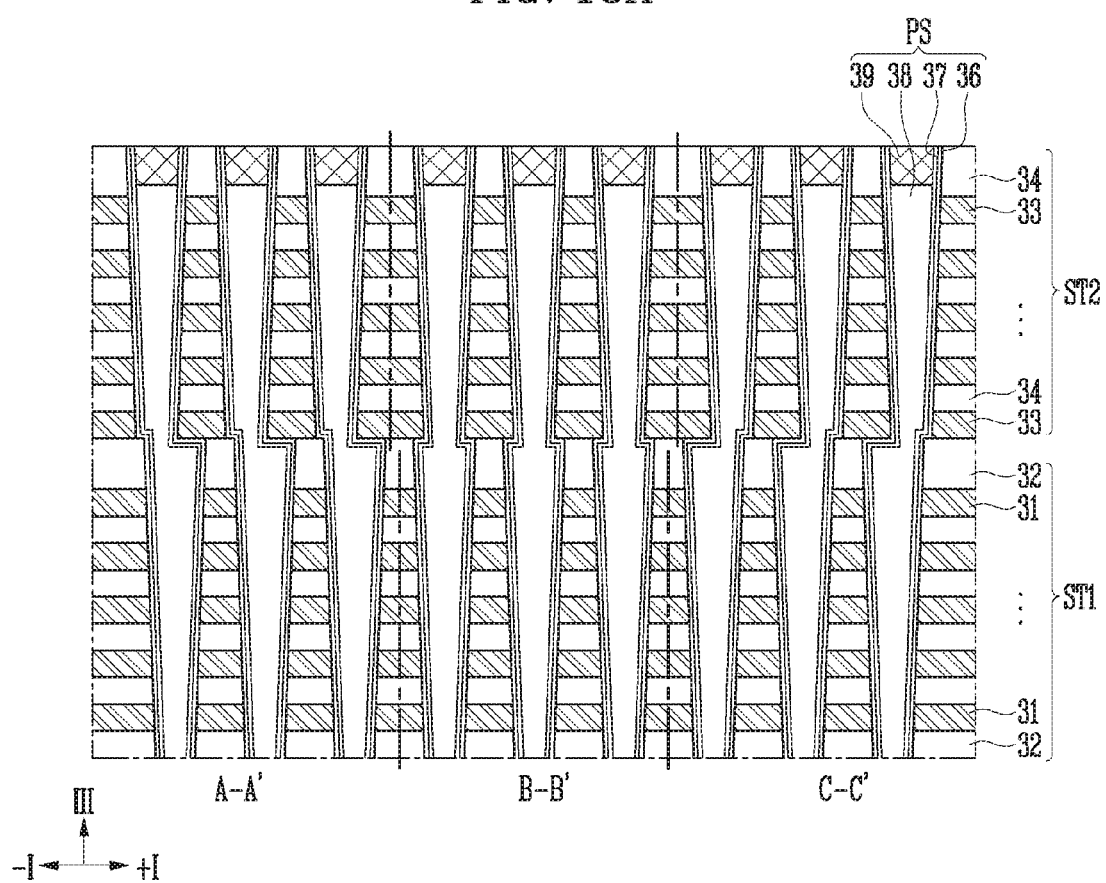
Figure 13B:
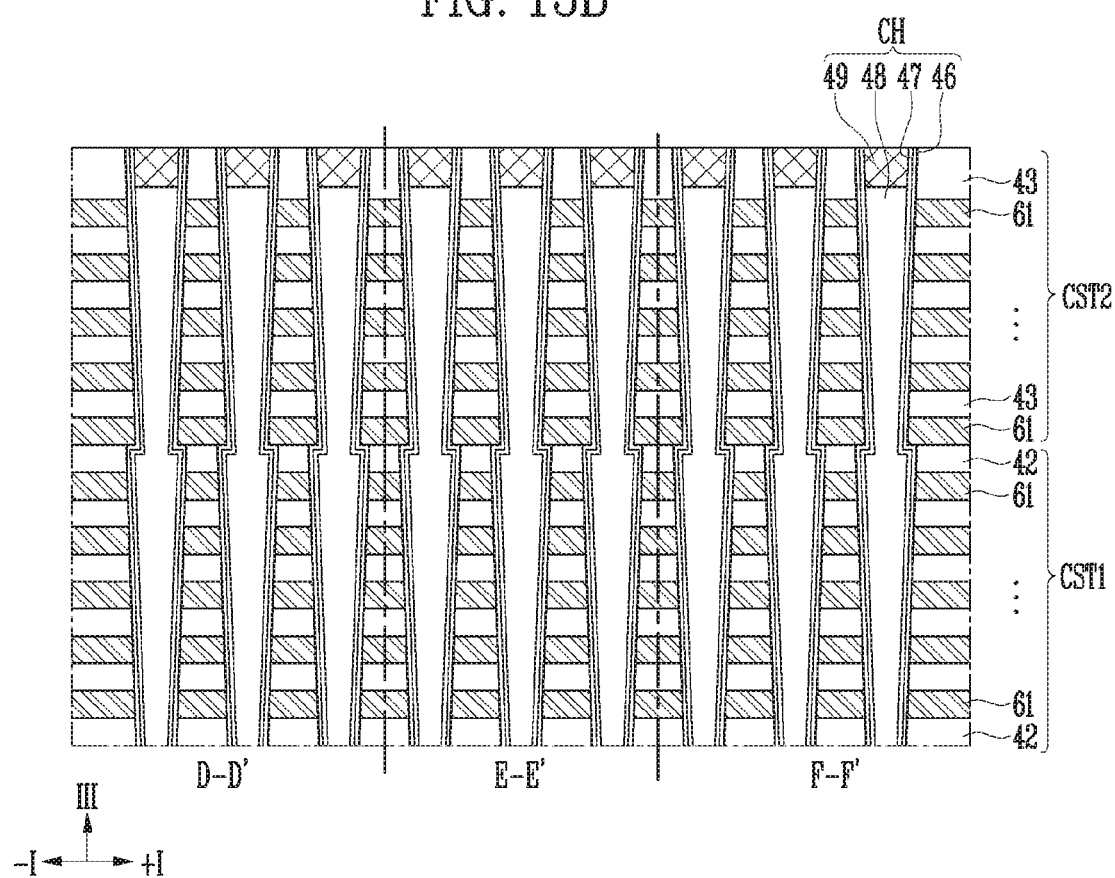

Referring to FIGS. 13A and 13B, the first sacrificial layers 35 are removed through the second holes H2. The first holes H1 may be again opened by selectively etching the first sacrificial layers 35. When the first sacrificial layer 35 is not exposed or only a portion of the first sacrificial layer 35 is exposed since the second hole H2 is misaligned, the first sacrificial layer 35 may not be removed or only a portion of the first sacrificial layer 35 may be removed. That is, the first sacrificial layer 35 may remain in the first hole H1, When the first sacrificial layers 35 are removed, the second sacrificial layers 45 may be removed through the second channel holes CHL2. The second channel holes CHL2 may be again opened by selectively etching the second sacrificial layers 45.

Subsequently, a channel structure CH is formed in the first channel holes CHL1 and second channel holes CHL2. The channel structure CH may include a memory layer 46, a channel layer 47, a gap fill layer 48, and a pad 49. When the channel structure CH is formed, a penetrating structure PS may be formed in the first holes H1 and the second holes H2. The penetrating structure PS may be a dummy channel structure, and include a dummy memory layer 36, a dummy channel layer 37, a dummy gap fill layer 38, and a dummy pad 39.

Subsequently, the first material layers 41 of the first cell stack structure CST1 and the third materials layers 43 of the second cell stack structure CST2 may be replaced with fifth material layers 61. When the first and third material layers 41 and 43 include a sacrificial material and the second and fourth materials layers 42 and 44 include an insulating material, the first and third material layers 41 and 43 may be replaced with conductive layers. When the first and third material layers 41 and 43 include a conductive material and the second and fourth materials layers 42 and 44 include an insulating material, the first and third material layers 41 and 43 may be silicided.

When the first and third material layers 41 and 43 are replaced with the fifth material layers 61, the first material layers 31 and the third material layers 33 may remain as they are. Alternatively, the first material layers 31 of the first stack structure ST1 and the third material layers 33 of the second stack structure ST2 may also be replaced with the fifth material layers 61.

According to the manufacturing method described above, when the cell stack structures CST1 and CST2 and the channel structure CH are formed, a monitoring pattern is formed together with the cell stack structures CST1 and CST2 and the channel structure CH. Thus, a position correction value of the second mask 52 can be calculated through the monitoring pattern. The position correction value can be applied to a manufacturing process of a next lot, and positions of the second mask 52 and the third mask, which are used in the next lot, can be corrected. Accordingly, the overlapping degree between the first channel holes CHL1 and the second channel holes CHL2 can be improved in the manufacturing process of the next lot.

Figure 14A:
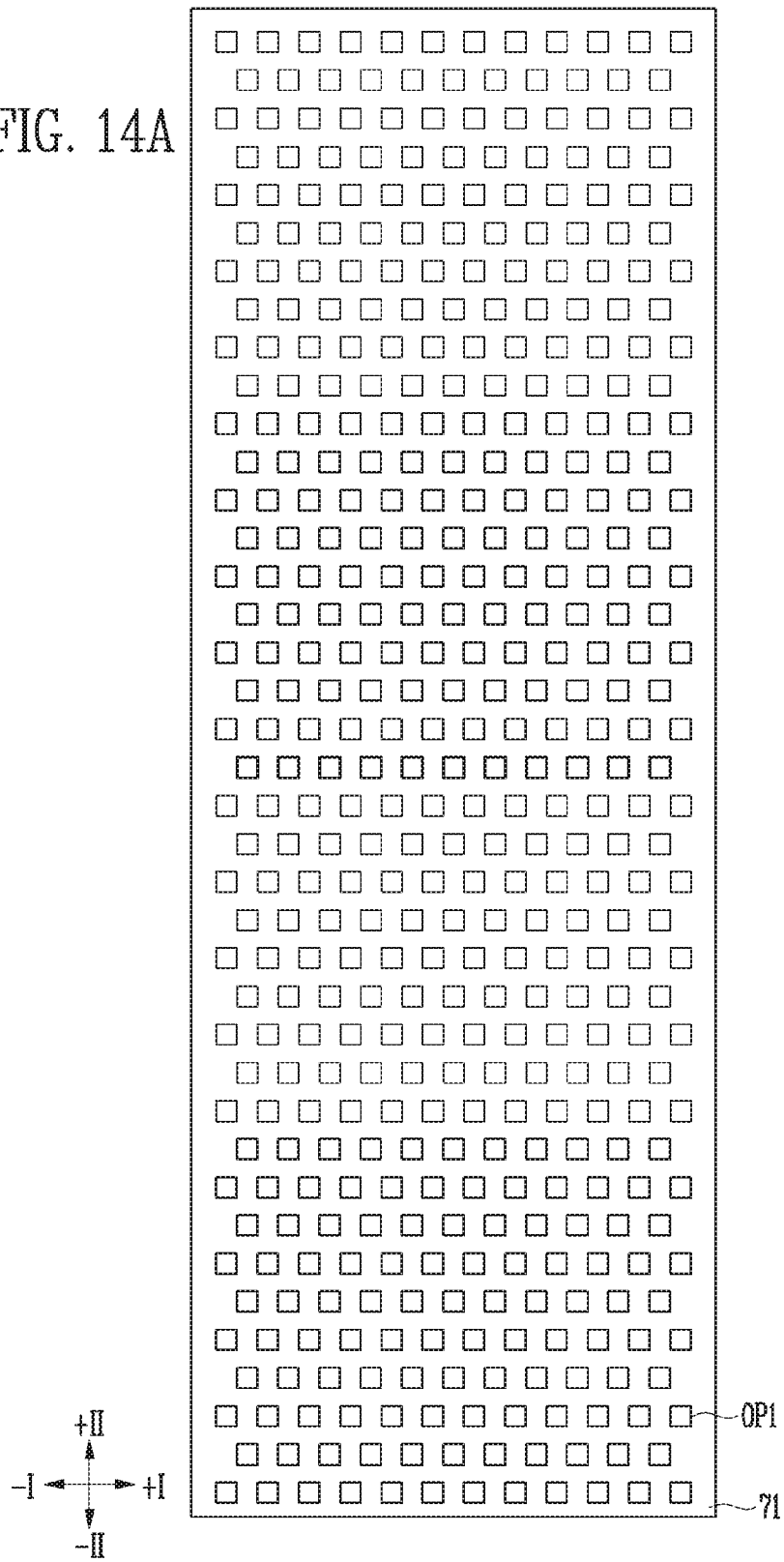
FIGS. 14A, 14B, and 14C are views illustrating a modification of a mask pattern in accordance with an embodiment of the present disclosure.
Figure 14B:
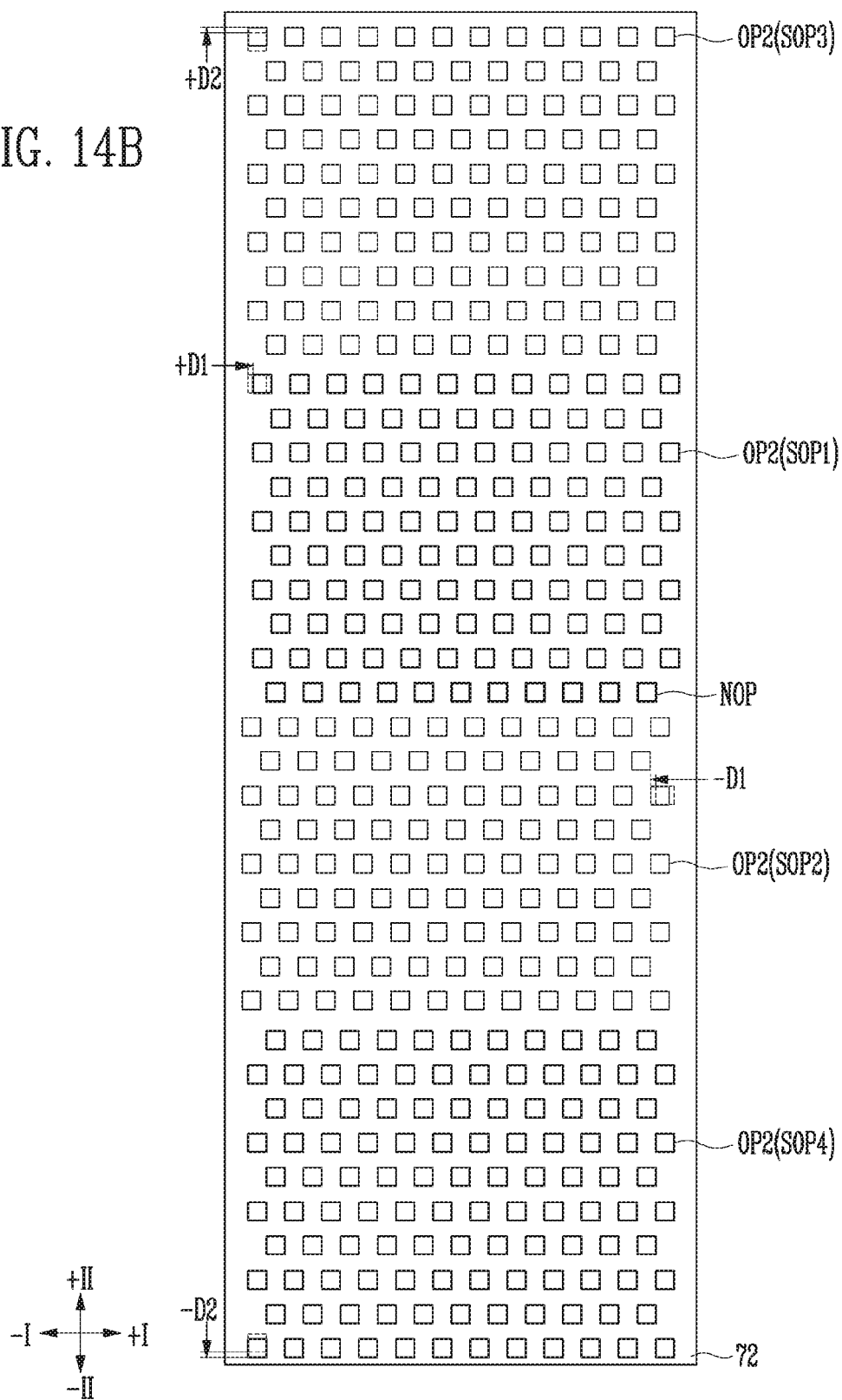
Figure 14C:
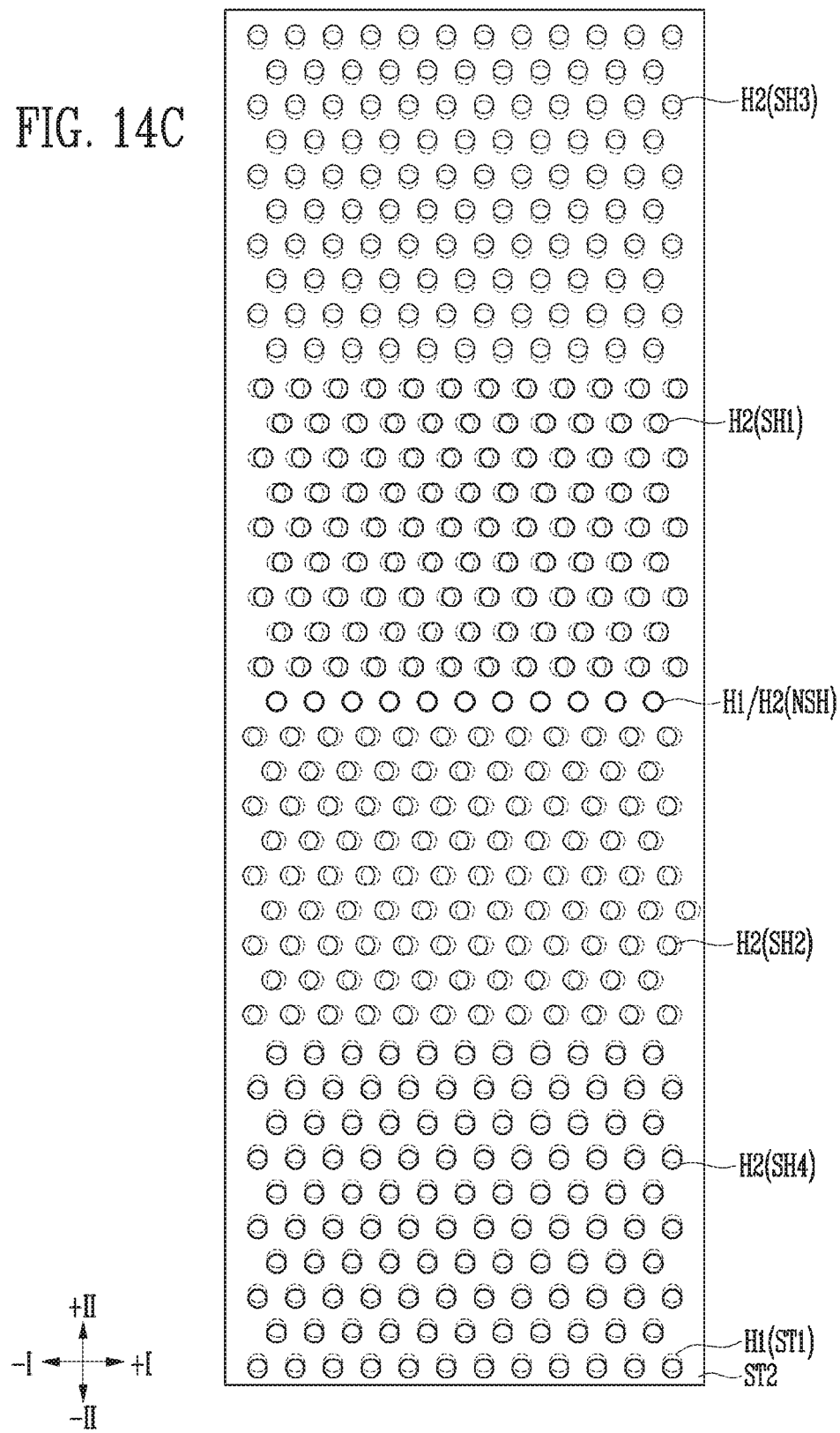

FIGS. 14A to 14C are views illustrating a modification of a mask pattern in accordance with an embodiment of the present disclosure. Hereinafter, descriptions of contents overlapping with those described above will be omitted.

Referring to FIGS. 14A and 14C, first holes H1 penetrating a first stack structure ST1 are formed by using a first mask 71. The first mask 71 may be a photo mask. The first mask 71 may include first openings OP1. The first openings OP1 may be arranged in the first direction I and the second direction II. The first holes H1 may be located corresponding to the first openings OP1. The first holes H1 may be arranged in the first direction I and the second direction II.

Referring to FIGS. 143 and 14C, second holes H2 penetrating a second stack structure ST2 are formed by using a second mask 72. The second mask 72 may be a photo mask. Second openings OP2 may be located corresponding to the first openings OP1. The second openings OP2 may include first shift openings SOP1 shifted by a first distance D1 in a positive first direction +I and second shift openings SOP2 shifted by the first distance D1 in a negative first direction −I. The second openings OP2 may include third shift openings SOP3 shifted by a second distance D2 in a positive second direction +II and fourth shift openings SOP4 shifted by the second distance D2 in a negative second direction −II. The second openings OP2 may include the first shift openings SOP1, the second shift openings SOP2, the third shift openings SOP3, and the fourth shift openings SOP4. The second openings OP2 may further include non-shift openings NOP aligned with the first openings OP1.

The first shift openings SOP1, the second shift openings SOP2, the third shift openings SOP3, the fourth shift openings SOP4, and the non-shift openings NOP may be arranged in various forms. The first shift openings SOP1, the second shift openings SOP2, the third shift openings SOP3, the fourth shift openings SOP4, and the non-shift openings NOP may be arranged in the second direction II. Although a case where the fourth shift openings SOP4, the second shift openings SOP2, the non-shift openings NOP, the first shift openings SOP1, and the third shift openings SOP3 are sequentially arranged has been illustrated in this embodiment, the present disclosure is not limited thereto. The arrangement form and sequence of the second openings OP2 may be variously changed.

The second holes H2 may be located corresponding to the second openings OP2. The second hole H2 may include first shift holes SH1 shifted in the positive first direction +I, second shift holes SH2 shifted in the negative first direction −I, third shift holes SH3 shifted in a positive second direction +II, and fourth shift holes SH4 shifted in a negative second direction −II. The second holes H2 may further include non-shift holes NSH aligned with the first holes H1. In addition, due to misalignment of the second mask 72, the second holes H2 may be entirely formed to be shifted in the positive first direction +I, the negative first direction −I, the positive second direction +II, or the negative second direction −II.

Figure 15A:
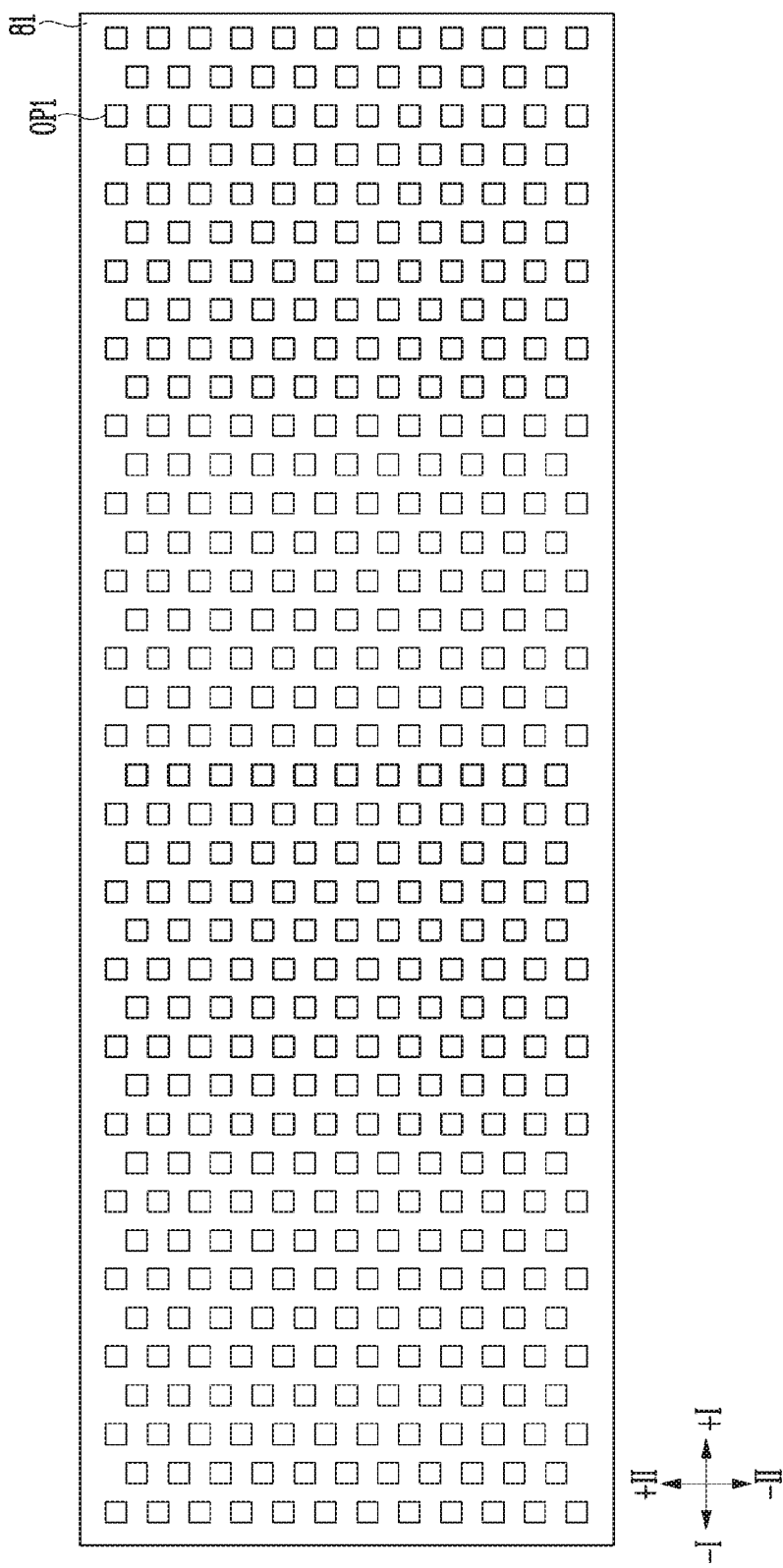

FIGS. 15A to 15C are views illustrating a modification of a mask pattern in accordance with an embodiment of the present disclosure.

Referring to FIGS. 15A and 15C, first holes H1 penetrating a first stack structure ST1 are formed by using a first mask 81. The first mask 81 may be a photo mask. The first mask 81 may include first openings OP1. The first openings OP1 may be arranged in the first direction I and the second direction II. The first holes H1 may be located corresponding to the first openings OP1. The first holes H1 may be arranged in the first direction I and the second direction II.

Referring to FIGS. 15B and 15C, second holes H2 penetrating a second stack structure ST2 are formed by using a second mask 82. The second mask 82 may be a photo mask. Second openings OP2 may be located corresponding to the first openings OP1. The second openings OP2 may include first shift openings SOP1 shifted by a first distance D1 in a positive first direction +I and second shift openings SOP2 shifted by the first distance D1 in a negative first direction −I. The second openings OP2 may include third shift openings SOP3 shifted by a second distance D2 in a positive second direction +II and fourth shift openings SOP4 shifted by the second distance D2 in a negative second direction −II. The second openings OP2 may include the first shift openings SOP1, the second shift openings SOP2, the third shift openings SOP3, and the fourth shift openings SOP4. The second openings OP2 may further include non-shift openings NOP aligned with the first openings OP1.

The first shift openings SOP1, the second shift openings SOP2, the third shift openings SOP3, the fourth shift openings SOP4, and the non-shift openings NOP may be arranged in various forms. The first shift openings SOP1, the second shift openings SOP2, the third shift openings SOP3, the fourth shift openings SOP4, and the non-shift openings NOP may be arranged in the first direction I. Although a case where the second shift openings SOP2, the third shift openings SOP3, the non-shift openings NOP, the fourth shift openings SOP4, and the first shift openings SOP1 are sequentially arranged has been illustrated in this embodiment, the present disclosure is not limited thereto. The arrangement form and sequence of the second openings OP2 may be variously changed.

The second holes H2 may be located corresponding to the second openings OP2. The second hole H2 may include first shift holes SH1 shifted in the positive first direction +I, second shift holes SH2 shifted in the negative first direction −I, third shift holes SH3 shifted in a positive second direction +II, and fourth shift holes SH4 shifted in a negative second direction −II. The second holes H2 may further include non-shift holes NSH aligned with the first holes H1. In addition, due to misalignment of the second mask 82, the second holes H2 may be entirely formed to be shifted in the positive first direction +I, the negative first direction −I, the positive second direction +II, or the negative second direction −II.

Figure 16:
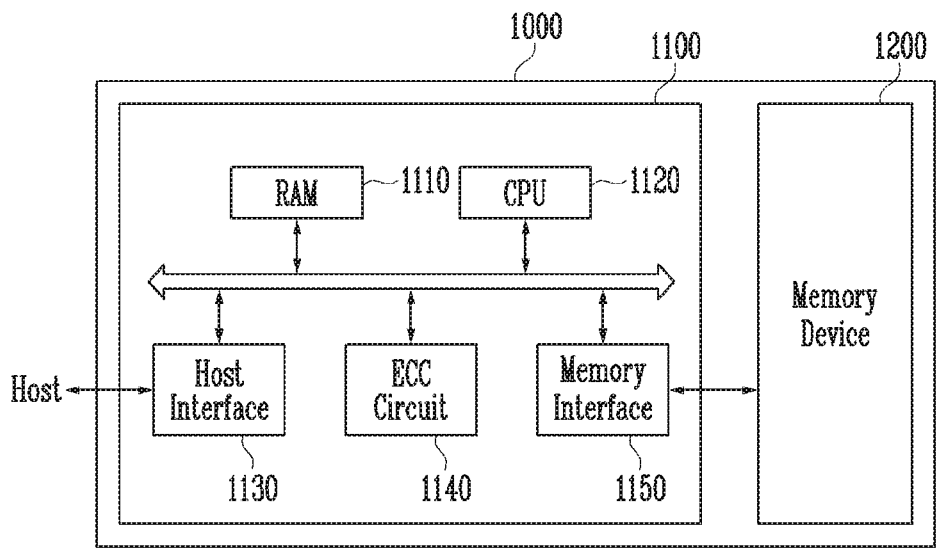
FIG. 16 is a block diagram illustrating a configuration of a memory system in accordance with an embodiment of the present disclosure.

FIG. 16 is a block diagram illustrating a configuration of a memory system in accordance with an embodiment of the present disclosure.

Referring to FIG. 16, the memory system 1000 in accordance with the embodiment of the present disclosure includes a memory device 1200 and a controller 1100.

The memory device 1200 is used to store data information having various data formats such as texts, graphics, and software codes. The memory device 1200 may be a nonvolatile memory. Also, the memory device 1200 may have the structures described with reference to FIGS. 1A to 15C, and be manufactured according to the manufacturing methods described with reference to FIGS. 1A to 15C. In an embodiment, the memory device 1200 may include: a first stack structure; first holes penetrating the first stack structure; a second stack structure located on the first stack structure; a first shift hole penetrating the second stack structure, the first shift hole being shifted in a positive first direction from a first hole; and a second shift hole penetrating the second stack structure, the second shift hole being shifted in a negative first direction from a first hole. The structure and manufacturing method of the memory device 1200 are the same as described above, and therefore, their detailed descriptions will be omitted.

The controller 1100 is connected to a host and the memory device 1200, and accesses the memory device 1200 in response to a request from the host. For example, the controller 1100 is configured to control reading, writing, erasing, and background operations of the memory device 1200.

The controller 1100 includes a random access memory (RAM) 1110, a central processing unit (CPU) 1120, a host interface 1130, an error correction code (ECC) circuit 1140, a memory interface 1150, and the like.

The RAM 1110 may be used as a working memory of the CPU 1120, a cache memory between the memory device 1200 and the host, and a buffer memory between the memory device 1200 and the host. The RAM 1110 may be replaced with a static random access memory (SRAM), a read only memory (ROM), etc.

The CPU 1120 controls overall operations of the controller 1100. For example, the CPU 1120 is configured to operate firmware such as a flash translation layer (FTL) stored in the RAM 1110.

The host interface 1130 is configured to interface with the host. For example, the controller 1100 communicates with the host using at least one of a variety of interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, an integrated drive electronics (IDE) protocol, and a private protocol.

The ECC circuit 1140 is configured to detect and correct an error included in data that is read from the memory device 1200, using an error correction code (ECC).

The memory interface 1150 may be configured to interface with the memory device 1200. For example, the memory interface 1150 includes an NAND interface or NOR interface.

The controller 1100 may further include a buffer memory (not shown) for temporarily storing data. The buffer memory may be used to temporarily store data transferred to the outside through the host interface 1130 or data transferred from the memory device 1200 through the memory interface 1150. The controller 1100 may further include a ROM that stores code data for interfacing with the host.

As described above, the memory system 1000 in accordance with the embodiment of the present disclosure includes the memory device 1200 having an improved degree of integration and improved characteristics, and thus the degree of integration and characteristics of the memory system 1000 can be improved.

Figure 17:
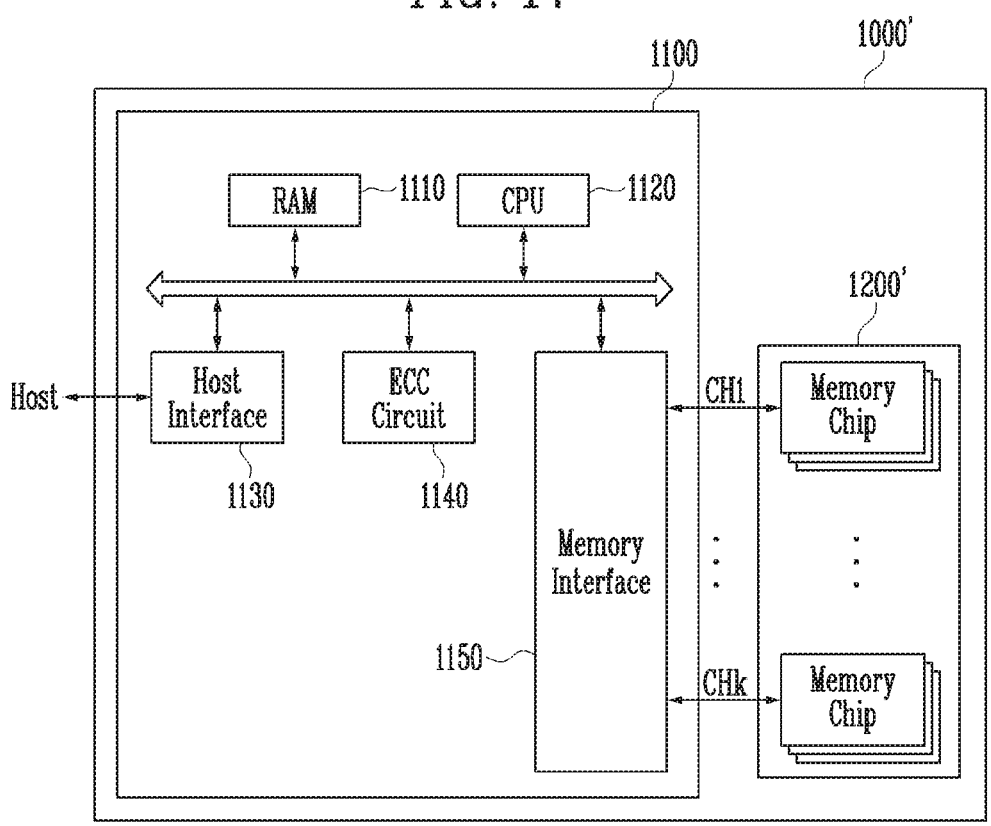
FIG. 17 is a block diagram illustrating a configuration of a memory system in accordance with an embodiment of the present disclosure.

FIG. 17 is a block diagram illustrating a configuration of a memory system in accordance with an embodiment of the present disclosure. Hereinafter, descriptions of contents overlapping with those described above will be omitted.

Referring to FIG. 17, the memory system 1000' in accordance with the embodiment of the present disclosure includes a memory device 1200' and a controller 1100. The controller 1100 includes a RAM 1110, a CPU 1120, a host interface 1130, an ECC circuit 1140, a memory interface 1150, and the like.

The memory device 1200' may be a nonvolatile memory. Also, the memory device 1200' may have the structures described with reference to FIGS. 1A to 15C, and be manufactured according to the manufacturing methods described with reference to FIGS. 1A to 15C. In an embodiment, the memory device 1200' may include: a first stack structure; first holes penetrating the first stack structure; a second stack structure located on the first stack structure; a first shift hole penetrating the second stack structure, the first shift hole being shifted in a positive first direction from a first hole; and a second shift hole penetrating the second stack structure, the second shift hole being shifted in a negative first direction from a first hole. The structure and manufacturing method of the memory device 1200' are the same as described above, and therefore, their detailed descriptions will be omitted.

The memory device 1200' may be a multi-chip package including a plurality of memory chips. The plurality of memory chips are divided into a plurality of groups, which are configured to communicate with the controller 1100 over first to kth channels (CH1 to CHk). In addition, memory chips included in one group may be configured to communicate with the controller 1100 over a common channel. For reference, the memory system 1000' may be modified such that one memory chip is connected to one channel.

As described above, the memory system 1000' in accordance with the embodiment of the present disclosure includes the memory device 1200' having an improved degree of integration and improved characteristics, and thus the degree of integration and characteristics of the memory system 1000' can be improved. Particularly, the memory device 1200' is configured as a multi-chip package, so that the data storage capacity of the memory system 1000' can be increased, and the operation speed of the memory system 1000' can be improved.

Figure 18:
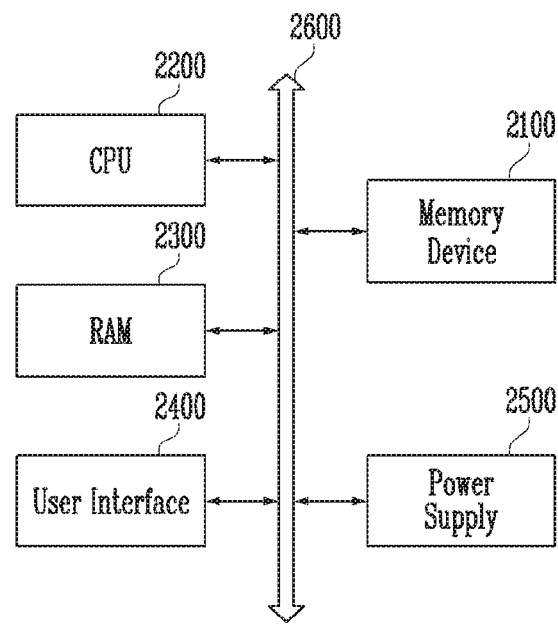
FIG. 18 is a block diagram illustrating a configuration of a computing system in accordance with an embodiment of the present disclosure.

FIG. 18 is a block diagram illustrating a configuration of a computing system in accordance with an embodiment of the present disclosure. Hereinafter, descriptions of contents overlapping with those described above will be omitted.

Referring to FIG. 18, the computing system 2000 in accordance with the embodiment of the present disclosure includes a memory device 2100, a CPU 2200, a RAM 2300, a user interface 2400, a power supply 2500, a system bus 2600, and the like.

The memory device 2100 stores data provided through the user interface 2400, data processed by the CPU 2200, and the like. In addition, the memory device 2100 is electrically connected to the CPU 2200, the RAM 2300, the user interface 2400, the power supply 2500, and the like through the system bus 2600. For example, the memory device 2100 may be connected to the system bus 2600 through a controller (not shown) or directly. When the memory device 2100 is directly connected to the system bus 2600, a function of the controller may be performed by the CPU 2200, the RAM 2300, etc.

The memory device 2100 may be a nonvolatile memory. The memory device 2100 may have the structures described with reference to FIGS. 1A to 15C, and be manufactured according to the manufacturing methods described with reference to FIGS. 1A to 15C. In an embodiment, the memory device 2100 may include: a first stack structure; first holes penetrating the first stack structure; a second stack structure located on the first stack structure; a first shift hole penetrating the second stack structure, the first shift hole being shifted in a positive first direction from a first hole; and a second shift hole penetrating the second stack structure, the second shift hole being shifted in a negative first direction from a first hole. The structure and manufacturing method of the memory device 2100 are the same as described above, and therefore, their detailed descriptions will be omitted.

The memory device 2100 may be a multi-chip package including a plurality of memory chips as described with reference to FIG. 17.

The computing system 2000 configured as described above may be a computer, an ultra-mobile PC (UMPC), a workstation, a netbook, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device for communicating information in a wireless environment, one of a variety of electronic devices constituting a home network, one of a variety of electronic devices constituting a computer network, one of a variety of electronic devices constituting a telematics network, an RFID device, etc.

As described above, the computing system 2000 in accordance with the embodiment of the present disclosure includes the memory device 2100 having an improved degree of integration and improved characteristics, and thus characteristics of the computing system 2000 can also be improved.

Figure 19:
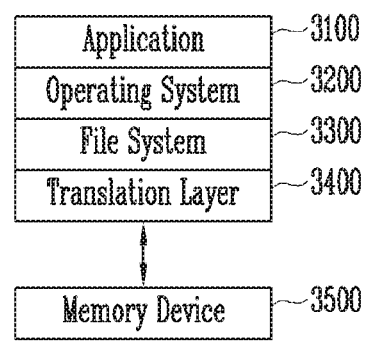
FIG. 19 is a block diagram illustrating a configuration of a computing system in accordance with an embodiment of the present disclosure.

FIG. 19 is a block diagram illustrating a configuration of a computing system in accordance with an embodiment of the present disclosure.

Referring to FIG. 19, the computing system 3000 in accordance with the embodiment of the present disclosure includes a software layer including an operating system 3200, an application 3100, a file system 3300, a translation layer 3400, and the like. In addition, the computing system 3000 includes a hardware layer of a memory device 3500, etc.

The operating system 3200 may manage software resources, hardware resources, etc. of the computing system 3000, and control program execution of a central processing unit. The application 3100 is one of a variety of application programs running on the computing system 3000, and may be a utility executed by the operating system 3200.

The file system 3300 means a logical structure for managing data, files, etc. in the computing system 3000, and organizes the data or files stored in the memory device 3500 according to a rule. The file system 3300 may be determined depending on the operating system 3200 used in the computing system 3000. For example, when the operating system 3200 is one of Windows operating systems of Microsoft, the file system 3300 may be a file allocation table (FAT) or a NT file system (NTFS). When the operating system 3200 is one of Unix/Linux operating systems, the file system 3300 may be an extended file system (EXT), a Unix file system (UFS), or a journaling file system (JFS).

In this drawing, the operating system 3200, the application 3100, and the file system 3300 are shown as individual blocks. However, the application 3100 and the file system 3300 may be included in the operating system 3200.

The translation layer 3400 translates an address into a form suitable for the memory device 3500 in response to a request from the file system 3300. For example, the translation layer 3400 translates a logical address generated by the file system 3300 into a physical address of the memory device 3500. Mapping information between the logical address and the physical address may be stored as an address translation table. For example, the translation layer 3400 may be a flash translation layer (FTL), a universal flash storage link layer (ULL), etc.

The memory device 3500 may be a nonvolatile memory. The memory device 3500 may have the structures described with reference to FIGS. 1A to 15C, and be manufactured according to the manufacturing methods described with reference to FIGS. 1A to 15C. In an embodiment, the memory device 3500 may include: a first stack structure;

first holes penetrating the first stack structure; a second stack structure located on the first stack structure; a first shift hole penetrating the second stack structure, the first shift hole being shifted in a positive first direction from a first hole; and a second shift hole penetrating the second stack structure, the second shift hole being shifted in a negative first direction from a first hole. The structure and manufacturing method of the memory device 3500 are the same as described above, and therefore, their detailed descriptions will be omitted.

The computing system 3000 configured as described above may be divided into an operating system layer performed in an upper level region and a controller layer performed in a lower level region. The application 3100, the operating system 3200, and the file system 3300 are included in the operating system layer and may be driven by a working memory of the computing system 3000. In addition, the translation layer 3400 may be included in the operating system layer or the controller layer.

As described above, the computing system 3000 in accordance with the embodiment of the present disclosure includes the memory device 3500 having an improved degree of integration and improved characteristics, and thus characteristics of the computing system 3000 can also be improved.

In accordance with the present disclosure, there can be provided a semiconductor device having a stable structure and improved reliability. Further, when the semiconductor device is manufactured, the level of difficulty of processes can be lowered, manufacturing procedures can be simplified, and manufacturing cost can be reduced.

The embodiments of the present disclosure have been described in the drawings and specification. Although specific terminologies are used here, this terminology is only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

What is claimed is:

1. A method of manufacturing a semiconductor device, the method comprising:
   forming a first stack structure;
   forming first holes penetrating the first stack structure;
   forming a second stack structure on the first stack structure;
   forming second holes penetrating the second stack structure;
   measuring first direction distances between edges of the first holes and edges of the second holes to calculate a first correction value, positions of the edges of the first holes are exposed through the second holes, respectively; and
   correcting a first direction position at which the second holes are to be formed by using the first correction value,
   wherein the second holes include one of a first shift hole shifted in a positive first direction from a first hole and a second shift hole shifted in a negative first direction from a first hole.

2. The method of claim 1, wherein, in the measuring of the first direction distances, a first direction distance between top surface edges of the first holes and bottom surface edges of the second holes is measured.

3. The method of claim 1, wherein the measuring of the first direction distances includes:
   measuring a first distance between an edge of the first shift hole and an edge of a first hole exposed through the first shift hole; and
   measuring a second distance between an edge of the second shift hole and an edge of a first hole exposed through the second shift hole.

4. The method of claim 3, wherein, in the correcting of the first direction position of the second holes, positions at which the second holes are to be formed are corrected in the negative first direction, when the first distance is greater than the second distance.

5. The method of claim 3, wherein positions at which the second holes are to be formed are corrected in the positive first direction, when the second distance is greater than the first distance.

6. The method of claim 1, wherein the second holes include one of a third shift hole shifted in a positive second direction from a first hole and a fourth shift hole shifted in a negative second direction from a first hole.

7. The method of claim 6, further comprising:
   measuring a second direction distance between edges of the first holes and edges of the third and fourth shift holes to calculate a second correction value, positions of the edges of the first holes are exposed through the third and fourth shift holes; and
   correcting a second direction position at which the second holes are to be formed by using the second correction value.

8. The method of claim 1, wherein the first holes have a width greater than that of the second holes at an interface between the first holes and the second holes.

9. The method of claim 1, wherein the second holes include a non-shift hole aligned with a first hole.

10. The method of claim 1, further comprising:
    forming a first cell stack structure;
    forming first channel holes penetrating the first cell stack structure;
    forming a second cell stack structure on the first cell stack structure; and
    forming second channel holes penetrating the second cell stack structure.

11. The method of claim 10, wherein the first channel holes are formed when the first holes are formed, and the second channel holes are formed when the second holes are formed.

12. The method of claim 10, further comprising correcting a first direction position at which the second channel holes are to be formed, by using the first correction value.

13. A method of manufacturing a semiconductor device, the method comprising:
    forming a first stack structure;
    forming first holes penetrating the first stack structure, by using a first mask including first openings;

forming a second stack structure on the first stack structure;

forming second holes penetrating the second stack structure, by using a second mask including second openings;

measuring first direction distances between edges of the first holes and edges of the second holes to calculate a first correction value, positions of the edges of the first holes are exposed through the second holes, respectively; and correcting a first direction position of the second mask by using the first correction value, wherein the second openings include one of a first shift opening shifted in a positive first direction from a first opening and a second shift opening shifted in a negative first direction from a first opening.

14. The method of claim 13, wherein the forming of the second holes includes:

forming a first shift hole shifted in the positive first direction from a first hole; and forming a second shift hole shifted in the negative first direction from a first hole.

15. The method of claim 14, wherein the measuring of the first direction distances includes:

measuring a first distance between an edge of a first hole exposed through the first shift hole and an edge of the first shift hole; and measuring a second distance between an edge of a first hole exposed through the second shift hole and an edge of the second shift hole.

16. The method of claim 15, wherein, in the correcting of the first direction position of the second mask, a position of the second mask is corrected in the negative first direction, when the first distance is greater than the second distance.

17. The method of claim 15, wherein, in the correcting of the first direction position of the second mask, a position of the second mask is corrected in the positive first direction, when the second distance is greater than the first distance.

18. The method of claim 13, wherein, in the measuring of the first direction distances, a first direction distance between top surface edges of the first holes and bottom surface edges of the second holes is measured.

19. The method of claim 13, wherein the second openings include one of a third shift opening shifted in a positive second direction from a first opening and a fourth shift opening shifted in a negative second direction from a first opening.

20. The method of claim 19, further comprising:

measuring a second direction distance between top surface edges of the first holes and bottom surface edges of the second holes to calculate a second correction value, positions of the top surface edges of the first holes are exposed through the second holes; and correcting a second direction position of the second mask by using the second correction value.

* * * * *